US008075704B2

(12) United States Patent
Spiegelman et al.

(10) Patent No.: US 8,075,704 B2
(45) Date of Patent: *Dec. 13, 2011

(54) METHOD FOR THE REMOVAL OF AIRBORNE MOLECULAR CONTAMINANTS USING OXYGEN AND/OR WATER GAS MIXTURES

(75) Inventors: Jeffrey J. Spiegelman, San Diego, CA (US); Daniel Alvarez, Jr., San Diego, CA (US); Russell J. Holmes, Santee, CA (US); Allan Tram, San Diego, CA (US)

(73) Assignee: Entegris, Inc., Billerica, MA (US)

( * ) Notice: Subject to any disclaimer, the term of this patent is extended or adjusted under 35 U.S.C. 154(b) by 336 days.

This patent is subject to a terminal disclaimer.

(21) Appl. No.: 10/523,371

(22) PCT Filed: Jun. 1, 2004

(86) PCT No.: PCT/US2004/017251

§ 371 (c)(1),
(2), (4) Date: Jun. 21, 2005

(87) PCT Pub. No.: WO2004/112117

PCT Pub. Date: Dec. 23, 2004

(65) Prior Publication Data

US 2006/0118138 A1 Jun. 8, 2006

(51) Int. Cl.
*B08B 5/00* (2006.01)

(52) U.S. Cl. .......... 134/30; 134/2; 134/10; 134/11; 134/21; 134/22.1; 134/22.11; 134/26; 134/34; 134/36; 134/37; 134/42

(58) Field of Classification Search ............ 134/2, 10, 134/11, 22.1, 22.11, 21, 26, 30, 34, 36, 37, 134/42

See application file for complete search history.

(56) References Cited

U.S. PATENT DOCUMENTS

| 4,276,368 A | * | 6/1981 | Heller et al. ............ 430/323 |
| 4,851,018 A | | 7/1989 | Lazzari et al. |
| 4,936,922 A | | 6/1990 | Cherry et al. |
| 5,013,335 A | | 5/1991 | Marcus |
| 5,160,512 A | | 11/1992 | Talu |
| 5,169,272 A | | 12/1992 | Bonora et al. |

(Continued)

FOREIGN PATENT DOCUMENTS

DE 199 24 058 A1 11/2000

(Continued)

OTHER PUBLICATIONS

Air composition, Engineering Tool Box, Dec. 24, 2008.*

(Continued)

*Primary Examiner* — Bibi Carrillo
(74) *Attorney, Agent, or Firm* — Hamilton, Brook, Smith & Reynolds, P.C.

(57) ABSTRACT

The present invention discloses a method for the removal of a number of molecular contaminants from surfaces within a device. A purge gas containing oxygen and/or water is introduced into the interior of the device, contacting at least a portion of the interior surfaces. A contaminated purge gas is produced by transferring a portion of the contamination from the interior surfaces into the purge gas. The contaminated purge gas is removed from the device and the process is continued until the contaminant concentration in the contaminated purge gas is below a predetermined level.

26 Claims, 29 Drawing Sheets

U.S. PATENT DOCUMENTS

| | | |
|---|---|---|
| 5,230,721 A | 7/1993 | Ohmi |
| 5,346,518 A | 9/1994 | Baseman et al. |
| 5,351,415 A | 10/1994 | Brooks et al. |
| 5,378,283 A | 1/1995 | Ushikawa |
| 5,425,793 A | 6/1995 | Mori et al. |
| 5,540,757 A | 7/1996 | Jordan, Sr. |
| 5,602,683 A | 2/1997 | Straaijer et al. |
| 5,607,647 A | 3/1997 | Kinkead |
| 5,644,855 A | 7/1997 | McDermott et al. |
| 5,661,225 A | 8/1997 | Ridgeway et al. |
| 5,676,737 A | 10/1997 | Whitlock |
| 5,786,042 A * | 7/1998 | Inoue et al. ............ 428/1.3 |
| 5,806,574 A | 9/1998 | Yamashita et al. |
| 5,810,062 A | 9/1998 | Bonora et al. |
| 5,833,726 A | 11/1998 | Kinkead et al. |
| 5,833,738 A | 11/1998 | Carrea et al. |
| 5,846,338 A | 12/1998 | Bonora et al. |
| 5,869,401 A | 2/1999 | Brunemeier et al. |
| 5,938,854 A | 8/1999 | Roth |
| 5,944,602 A | 8/1999 | Grundy |
| 5,968,232 A | 10/1999 | Whitlock |
| 5,988,233 A | 11/1999 | Fosnight et al. |
| 6,056,026 A | 5/2000 | Fosnight et al. |
| 6,116,858 A | 9/2000 | Narabayashi |
| 6,124,211 A | 9/2000 | Butterbaugh et al. |
| 6,146,531 A * | 11/2000 | Matheson ............ 210/606 |
| 6,164,664 A | 12/2000 | Fosnight et al. |
| 6,199,604 B1 | 3/2001 | Miyajima |
| 6,221,132 B1 | 4/2001 | Dong et al. |
| 6,249,932 B1 | 6/2001 | Chu et al. |
| 6,319,297 B1 | 11/2001 | Fosnight |
| 6,364,762 B1 | 4/2002 | Kaveh et al. |
| 6,391,090 B1 | 5/2002 | Alvarez, Jr. et al. |
| 6,422,823 B2 | 7/2002 | Bernard et al. |
| 6,427,703 B1 | 8/2002 | Somekh |
| 6,443,191 B1 | 9/2002 | Murayama et al. |
| 6,461,410 B1 | 10/2002 | Abe et al. |
| 6,473,996 B1 | 11/2002 | Tokunaga |
| 6,507,390 B1 | 1/2003 | Ivaldi |
| 6,610,123 B2 | 8/2003 | Wu et al. |
| 6,638,341 B1 | 10/2003 | Spiegelman et al. |
| 6,652,667 B2 * | 11/2003 | Ahmadi et al. ............ 134/36 |
| 6,696,367 B1 | 2/2004 | Aggarwal et al. |
| 6,701,972 B2 | 3/2004 | Dickinson et al. |
| 6,710,845 B2 | 3/2004 | Wu et al. |
| 6,724,460 B2 | 4/2004 | Van Schaik et al. |
| 6,729,041 B2 | 5/2004 | Shindo et al. |
| 6,747,729 B2 | 6/2004 | Pril et al. |
| 6,755,221 B2 | 6/2004 | Jeong et al. |
| 6,758,876 B2 | 7/2004 | Suzuki et al. |
| 6,797,029 B2 | 9/2004 | Lederer et al. |
| 6,867,153 B2 | 3/2005 | Tokunaga |
| 6,899,145 B2 | 5/2005 | Aggarwal |
| 6,913,654 B2 | 7/2005 | Alvarez, Jr. et al. |
| 6,919,102 B2 | 7/2005 | Chen |
| 6,922,867 B1 | 8/2005 | Hao |
| 6,974,505 B2 | 12/2005 | Shih et al. |
| 7,113,254 B2 | 9/2006 | Van Der Net et al. |
| 7,189,291 B2 | 3/2007 | Spiegelman et al. |
| 7,208,428 B2 | 4/2007 | Hishiya et al. |
| 7,335,244 B2 | 2/2008 | Kisakibaru et al. |
| 7,377,982 B2 * | 5/2008 | Alvarez et al. ............ 134/26 |
| 2002/0018189 A1 | 2/2002 | Mulkens et al. |
| 2002/0088478 A1 | 7/2002 | Degendt et al. |
| 2002/0124906 A1 | 9/2002 | Suzuki et al. |
| 2002/0129707 A1 | 9/2002 | Tanaka et al. |
| 2002/0132480 A1 | 9/2002 | Shindo et al. |
| 2002/0192129 A1 | 12/2002 | Shamouilian et al. |
| 2003/0096193 A1 | 5/2003 | Van Schaik et al. |
| 2004/0000328 A1 | 1/2004 | Liu et al. |
| 2004/0145716 A1 | 7/2004 | Wu et al. |
| 2004/0237777 A1 | 12/2004 | Alvarez et al. |
| 2004/0238013 A1 | 12/2004 | Spiegelman et al. |
| 2005/0017198 A1 | 1/2005 | Van Der Net et al. |
| 2005/0087133 A1 | 4/2005 | Shindo et al. |
| 2005/0111935 A1 | 5/2005 | Kim et al. |
| 2005/0205114 A1 | 9/2005 | Alvarez, Jr. et al. |
| 2006/0118138 A1 | 6/2006 | Spiegelman et al. |
| 2006/0285091 A1 | 12/2006 | Parekh et al. |
| 2007/0030463 A1 | 2/2007 | Parekh et al. |
| 2007/0114467 A1 | 5/2007 | Van Der Net et al. |
| 2007/0137676 A1 | 6/2007 | Spiegelman et al. |
| 2007/0144118 A1 | 6/2007 | Alvarez et al. |
| 2009/0272461 A1 | 11/2009 | Alvarez, Jr. et al. |

FOREIGN PATENT DOCUMENTS

| | | |
|---|---|---|
| EP | 0 617 573 B1 | 9/1994 |
| EP | 0 867 924 A2 | 9/1998 |
| EP | 1 067 583 A2 | 1/2001 |
| EP | 1 182 694 A2 | 2/2002 |
| EP | 1 343 202 A1 | 9/2003 |
| JP | 3-225824 A | 10/1991 |
| JP | 4305927 A | 10/1992 |
| JP | 10085634 A | 7/1998 |
| JP | 2000093904 A | 4/2000 |
| JP | 2002-217157 A | 8/2002 |
| SG | 117769 | 7/2007 |
| SG | 124510 | 2/2009 |
| WO | WO 98/42362 | 10/1998 |
| WO | WO 99/62955 | 12/1999 |
| WO | WO 01/37329 A1 | 5/2001 |
| WO | WO 02/47142 A1 | 6/2002 |
| WO | WO 2004/077015 A2 | 9/2004 |
| WO | WO 2004/077015 A3 | 9/2004 |
| WO | WO 2004/112117 A1 | 12/2004 |
| WO | WO 2005/008339 A2 | 1/2005 |
| WO | WO 2005/010619 | 2/2005 |
| WO | WO 2005/078771 A2 | 8/2005 |
| WO | WO 2005/078771 A3 | 8/2005 |
| WO | WO 2007/019105 A1 | 2/2007 |
| WO | WO 2007/120451 A1 | 10/2007 |

OTHER PUBLICATIONS

Handbook of Semiconductor Wafer Cleaning Technology, Science, Technology, and Applications, Werner Kern Associates, eds., (NJ: Noyes Publications) pp. 88-89 (1993).

Veillerot, Marc, "A Method for Measuring AMC Concentrations Inside Wafer Containers," Materials Integrity Management Symposium 2003.

Martin, Ray et al., "Status of Microenvironment Gas Purge in the Semiconductor Industry," Materials Integrity Management Symposium 2003.

Davidson, John, "The Expanding Role of Bare Reticle Stockers in Photolithography," Materials Integrity Management Symposium 2003.

Veillerot et al., "Organic Contamination: Purge Gas Impace in Plastic Storage Boxes," Solid State Phenomena, vol. 92, pp. 105-108 (2003).

Veillerot et al., "Testing the use of purge gas in wafer storage and transport containers," [online] 1997-2003 [retrieved Nov. 10, 2004]. Retrieved from the Internet <URL: http://www.micromagazine.com/archive/03/08/verllerot.html.

Pearlstein et al., "Evaluating electronics-grade gas-line purging requirements," [online] Mar. 2001 [retrieved Oct. 18, 2004]. Retrieved from the Internet <URL: http://sst.pennnet.com/Articles/Article_Display.cfm?Section=ARCHI&ARTICLE_ID=95491 &VERSION_NUM=1&p=5.

Office Action, Israel Patent Application No. 172210, dated Jun. 8, 2009, in Hebrew with English translation.

Notice of Rejection, Japanese Patent Application No. 2006-515059, dated Sep. 10, 2009, English translation.

Communication Pursuant to Article 94(3) EPC, European Patent Application No. 04753969.7-2113, dated May 13, 2009.

Partial European Search Report for EP 09170473 dated Sep. 30, 2009.

Office Action from European Patent Office for 05712656.7-2222, dated May 2, 2007.

Office Action from European Patent Office for 05712656.7-2222, dated Oct. 5, 2007.

Office Action from European Patent Office for 05712656.7-2222, dated Apr. 11, 2008.

Office Action from European Patent Office for 05712656.7-2222, dated Dec. 12, 2008.

Invitation to Respond to Written Opinion for 200605062-9, dated Oct. 11, 2007.
Examination Report for 200605062-9, dated May 26, 2008.
Decision of Granting Patent Right for Invention for 200580009743.4, dated Oct. 31, 2008.
Notification of First Office Action for 200580009743.4, dated Aug. 17, 2007.
Chinese Patent Application—Text of the Second Office Action for 200580009743.4, dated May 23, 2008.
Chinese Patent Application—First Office Action for 200680030728.2, dated Jun. 2009.
Notice of Allowance from European Patent Office for 05712656.7-2222, dated May 4, 2009.
Office. Action for U.S. Appl. No. 11/318,258, dated Apr. 29, 2009.
Notification of Defects in Patent Application No. 172210, dated Dec. 1, 2009.
Camenzind, M., et al., "Surface Molecular Contamination: Molecular Contamination Issues in the Electronics Industry," Paper presented at the CLEAN ROOMS conference, Boston, MA (Mar. 2005).
Holmes, R.J., et al., "Purge Gases for the Removal of Airborne Molecular Contamination During the Storage and Transport of Silicon Wafers," *Semiconductor Manufacturing*, (Dec. 2004).
Münter, N., et al., "Formation of Time-Dependent Haze on Silicon Wafers," *Solid State Phenomena*, 92:109-112 (2003).
Sherwood, E., et al., "Integrated Minienvironment Design Best Practices," *International SEMATECH*; Technology Transfer # 99033693A-ENG, Mar. 31, 1999, [retrieved on Feb. 4, 2009]. Retrieved from the URL ismi.sematech.org/docubase/document/3693aeng.pdf).
European Search Report for EP 09170473 dated Feb. 1, 2010.
Examination and Search Report for Taiwan Application No. 93115628, dated Mar. 5, 2010.
Jiang, X., et al., "Photolithography Advances Push, Purge-Gas Purification," Solid State Technology, pp. 53-56 (2002).
Search Report of Taiwan Patent Application No. 093115628, date of completion of search Dec. 2, 2009.
Translation of Notice of Rejection ($2^{nd}$ Office Action) for Japanese Patent Application No. 2006-515059, 5 pages.
Webster's II New Riverside University Dictionary, 1984, Definitions of "pure" and "transfer".
U.S. Patent and Trademark Office, Office Action, U.S. Appl. No. 11/706,044, dated Sep. 3, 2010.
International Preliminary Report on Patentability for PCT/US2005/003287, dated Aug. 17, 2006.
International Preliminary Report on Patentability for PCT/US2006/029666, dated Nov. 16, 2007.
International Search Report and Written Opinion for PCT/US2005/003287, dated Sep. 5, 2005.
International Search Report and Written Opinion of the International Searching Authority for PCT/US2006/029666) dated Dec. 13, 2006.
International Search Report, Application No. PCT/US2004/017251, date of mailing Nov. 9, 2004.
International Preliminary Report on Patentability and Written Opinion, Application No. PCT/US2004/017251, date of mailing Dec. 22, 2005.
Office Action, U.S. Appl. No. 11/706;044, Date of mailing: Mar. 1, 2011.

\* cited by examiner

Wafer Chamber

METHOD FOR THE REMOVAL OF AIRBORNE MOLECULAR CONTAMINANTS USING OXYGEN AND/OR WATER GAS MIXTURES

RELATED APPLICATIONS

This application is the U.S. National Stage of International Application No. PCT/US2004/017251, filed Jun. 1, 2004, published in English, and claims priority under 35 U.S.C. §365 to U.S. application Ser. No. 10/683,903, filed Oct. 10, 2003, which claims the benefit of U.S. Provisional Application No. 60/475,145, filed on Jun. 2, 2003; and U.S. application Ser. No. 10/683,904, filed Oct. 10, 2003, which claims the benefit of U.S. Provisional Application No. 60/475,145, filed on Jun. 2, 2003. The entire teachings of the above applications are incorporated herein by reference.

BACKGROUND OF THE INVENTION

In the manufacture of high purity products, such as silicon wafers, intended for semiconductor substrates or in the photolithography steps of manufacture of semiconductors, it is necessary to maintain a high degree of cleanliness. The products themselves must be clean, the atmospheres surrounding them throughout the manufacturing process must be clean, and the steps and equipment used in the manufacture must not impair cleanliness. It is well known that with the minute sizes of circuitry and components incorporated into semiconductor chips, even extremely small contaminant particles when deposited on chip surfaces are destructive to the chips. It is common for loss rates of wafers and chips during manufacturing to be a significant portion of the total production due to system contamination.

Manufacturers of wafers and chips have been engaged in extensive and continual efforts to improve on the cleanliness of their fabrication facilities ("fabs") including efforts to have manufacturing and process materials and gases of high purity. Such efforts have been generally successful in the past, in that gases with purities defined by contaminant levels in the parts per million (ppm) and even into the parts per billion (ppb) ranges have been achieved. Generally improvements in process system cleanliness have paralleled increases in the component density of chips and reductions in the size of chip components and circuitry.

However, the ability of the prior art to achieve such parallel improvements in gases has more recently been severely taxed as the size of chip components has continued to decrease and component density has continued to increase. With the movement to 198 nm and 157 nm semiconductor technologies, the ability of the products to tolerate contamination has substantially decreased, and process gases that previously were of adequate purities are no longer suitable. Scale-up techniques that previously achieved adequate improvements in the purity of such gases have been found to be ineffective in these "ultra high purity" (UHP) systems in which the lower nm level technologies are produced. Further, at the lower IC dimensions materials that were previously considered minor contaminants have been found to act as major contaminants, and the prior art gases have been found to be ineffective in removing such contaminant materials.

Ultrahigh purity products and process tools are susceptible to airborne molecular contaminants (AMCs) that can reduce product quality and yield. AMCs generally include, but are not limited to $SO_x$, $NO_x$, siloxanes, organophosphorus compounds, ammonia, moisture, oxygen and hydrocarbons (>4 carbons). For purposes of the present invention, oxygen and moisture are not considered to be AMCs.

In the production of wafers for the semiconductor industry, there are three major sources of contamination, wafer storage containers (for example, Front-Opening Unified Pods or FOUPs) themselves; clean room air that enters the container as the wafers are moved between tools and the wafers themselves that may leech contaminants during the various manufacturing processes. Methods have been developed to sufficiently reduce water and oxygen contamination in the manufacturing process. Additionally, methods have been developed for the removal of reaction products of the wafer with water and oxygen (e.g., silicon oxides) that can form on the surface of the wafers. However, technologies have not developed for the efficient removal of a number of airborne contaminants and their resulting reaction products on wafers.

Various contaminants have different effects. For example, in photolithography simple hydrocarbons can condense on the lens assembly and result in transmission loss. Heavy hydrocarbons and significant concentrations of light hydrocarbons irreversibly deposit on optical surfaces and become graphitized by ultraviolet (UV) exposure. In a similar manner, silicon-containing organics, e.g., siloxanes, react under UV irradiation to produce $SiO_2$ crystallites that refract and absorb the incident light. Other AMCs, e.g., $NO_x$ and $SOX_x$, typically wherein $0 < x \leq 3$, cause optical hazing. Basic AMCs, e.g., amines, quench the photoacids, in addition to causing optical hazing. In the context of photolithography, oxygen and water can be detrimental to the production process and are typically considered to be AMCs in the prior art. Recently, its has been reported by Veillerot et al., (*Solid State Phenomena* Vol. 92, 2003, pp. 105-108) that atmospheric hydrocarbon contamination has a detrimental impact on 4.5 nm gate oxide integrity when wafers are stored in a continuous flow of purge gas between gas oxide and polysilicon deposition steps.

Approaches being tried to reduce this contamination include large-scale chemical filtration of the cleanroom air, moving from open to closed cassettes, and nitrogen purging of wafers during storage and transport. Nitrogen purging of UHP components such as valves and gas delivery piping, has been practiced for many years, and can be effective in removing oxygen and water. However, large scale use of nitrogen for purging large volume IC process equipment and large numbers of cassettes can be expensive and present a serious asphyxiation hazard. Additionally, it is suspected that nitrogen purging of hydrocarbon contaminated surfaces is not completely effective in removing the hydrocarbons.

Methods for analysis of contaminants in gas streams are well known. FIG. 1 (Prior Art) is a schematic flow diagram of a double dilution system 100 coupled to a gas chromatograph gas analysis system 120. The double dilution system 100 comprising mass flow controllers 106, 108, 110, and 112 enables the precise dilution of a gas standard 114 with a carrier gas 102 over a range of six orders of magnitude ($10^6$). Commonly available gas standards in the part per million range can be effectively diluted to the part per trillion (ppt) range with system 100. The dilution system 100 can be coupled to a gas chromatograph system 120 for the purposes of calibrating the response of the chromatograph 126, by connecting the output 116 of the dilution system to the input 122 of the chromatographic gas analysis system 120. A cold trap 124 accumulates condensed hydrocarbons in the sample, prior to injection into the gas chromatograph 126. In this manner, the effective sensitivity of the chromatograph can be increased and ppt level hydrocarbon concentrations reliably measured.

FIG. 2 (Prior Art) is a calibration graph 200 of signal response area 204 versus sample hydrocarbon concentration 202 for various hydrocarbon molecules including benzene 206, toluene 208, ethyl-benzene 210, meta,para-xylene 212, ortho-xylene 214, a second toluene 216, for the analysis system 120 coupled to dilution system 100. The data 220 show a linear response relationship between the peak area 204 and concentration 202 over almost six orders of magnitude, with a minimum sensitivity of 1 ppt FIG. 3 (Prior Art) is a graph 300 of time 302 versus gas chromatograph 126 detector signal 304 for a sample containing 1 ppt each of benzene, toluene, ethyl-benzene, and xylene. Here it can be seen that 1 ppt level concentrations for each of the hydrocarbons in the mixture result in clearly distinguished peaks for benzene 306, toluene 308, ethyl-benzene 310, and xylene 312.

SUMMARY OF THE INVENTION

The present invention is generally directed to a method for removing airborne molecular contaminants (AMC) from a surface comprising contacting at least a portion of the surface and the area surrounding the surface with a purified purge gas, where the purge gas comprises oxygen, water or a combination thereof, and the purified purge gas has an AMC concentration less than about 1 part per billion (ppb) on a volume basis; producing a contaminated purge gas by transferring a portion of the contaminants from the surface into the purified purge gas; and removing the contaminated purge gas from the surface.

It is an object of the present invention to provide a method for the removal of airborne molecular contaminants (AMCs) from surfaces, generally within a device. In one embodiment, the method comprises introducing a purge gas containing oxygen and preferably having an AMC concentration of less than 1 part per billion on a volume basis into an interior portion of the device, contacting at least a portion of the surfaces with the purge gas, producing a contaminated purge gas by transferring a portion of the molecular contaminants from the surfaces into the purge gas, and removing the contaminated purge gas from the device. The preceding steps are typically continued or repeated until the contaminant concentration in the contaminated purge gas is decreased to a desired level, preferably below 1 part per billion on a volume basis, more preferably below 100 ppt contaminant on a volume basis. Additionally, the oxygen containing purge gas may further include moisture (i.e., water).

In a further embodiment of the present invention, the method comprises purifying a purge gas containing oxygen at a concentration between 1 and 25 volume %, also preferably having a molecular contaminant concentration of less than 1 ppb, introducing the purified purge gas into an interior portion of the device, contacting at least a portion of the surfaces with the purified purge gas, producing a contaminated purge gas by transferring a portion of the molecular contaminants from the surfaces into the purified purge gas, and removing the contaminated purge gas from said device. The method typically further comprises continuing the preceding steps until a contaminant concentration in the contaminated purge gas is decreased to a desired level, preferably below about 1 ppb, more preferably below about 100 ppt. Additionally, the oxygen containing purge gas may contain water at a concentration between about 100 ppm to about 2 volume %.

In a third embodiment of the present invention, the method comprises purifying a purge gas containing water (e.g., at a concentration between about 100 ppm and about 2 volume % moisture) with the overall mixture having a molecular contaminant concentration of less than 1 ppb, introducing the purified purge gas into an interior portion of the device, contacting at least a portion of the surfaces with the purified purge gas, producing a contaminated purge gas by transferring a portion of the molecular contaminants from the surfaces into the purified purge gas, and removing the purified purge gas from said device. The method typically further comprises continuing the preceding steps until the contaminant concentration in the contaminated purge gas is decreased to a desired level, preferably below about 1 ppb contaminant on a volume basis, more preferably below about 100 ppt contaminant.

The methods disclosed herein are particularly useful for removing contaminants from surfaces such as the interior surface of an ultrahigh purity gas line and the interior surface of valves present in a gas line, along with the interior surface of stainless steel chambers (e.g. chambers used for manufacturing silicon wafers).

DETAILED DESCRIPTION OF THE INVENTION

Figure 1:
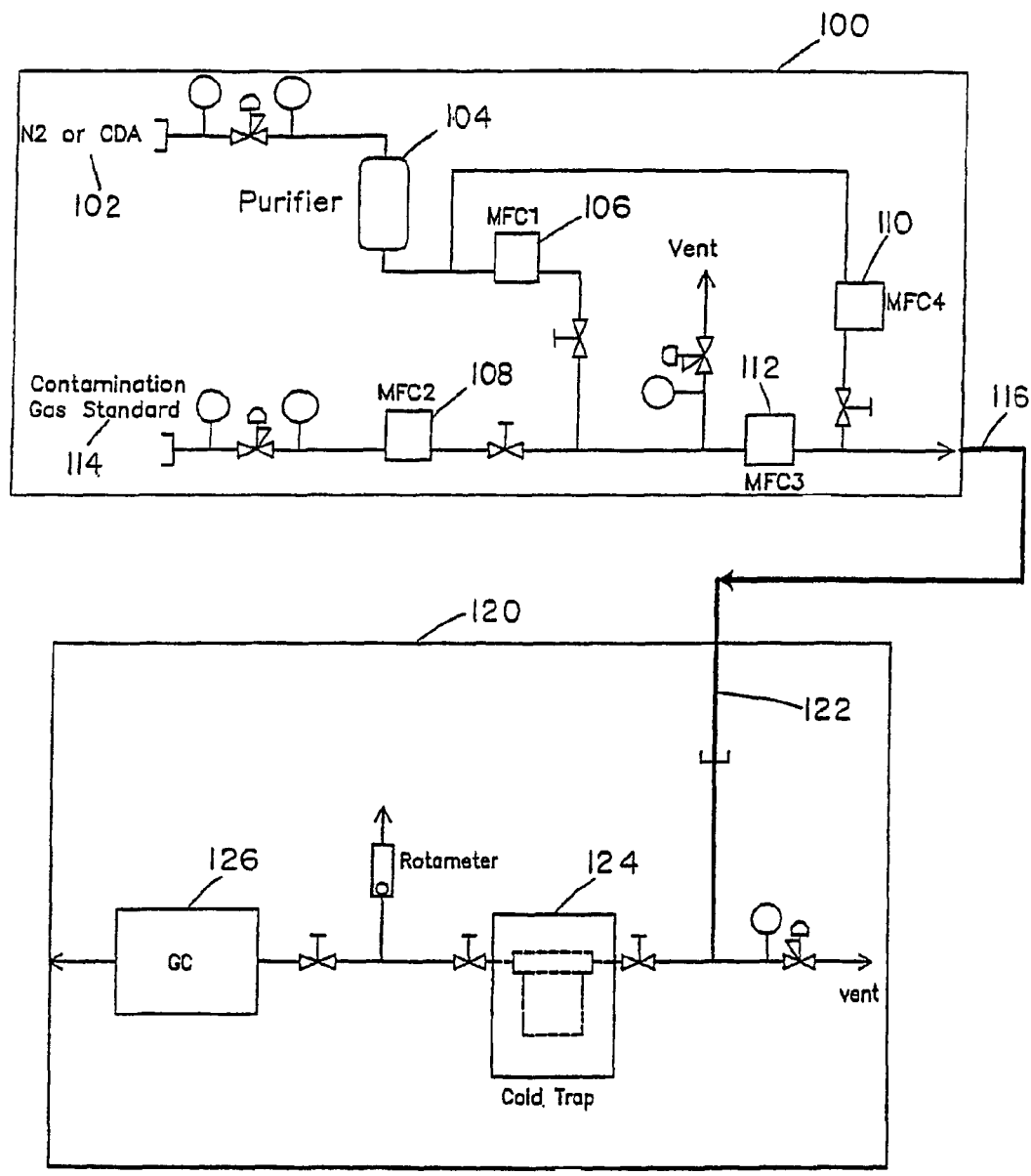
FIG. 1 is a schematic flow diagram of a double dilution manifold coupled to a gas chromatograph gas analysis system.
Figure 2:
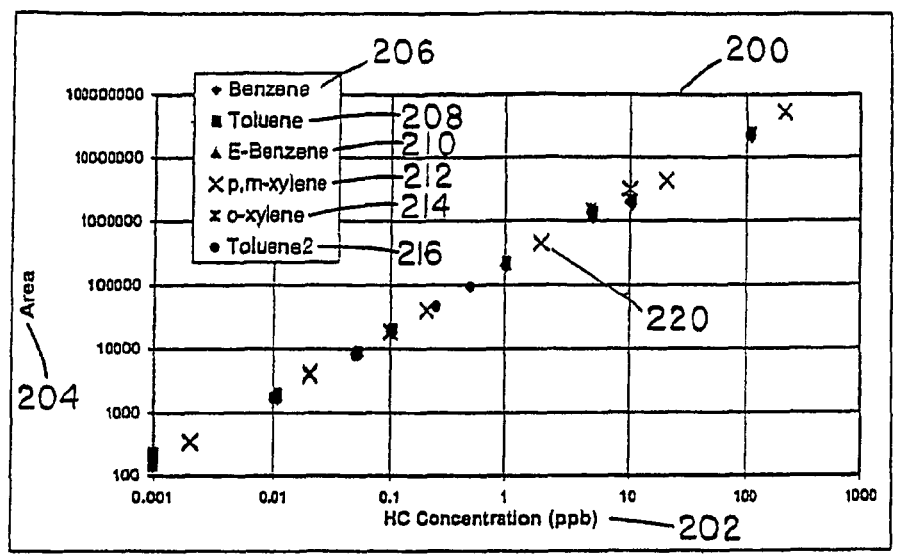
FIG. 2 is a calibration graph for the apparatus of FIG. 1 showing signal response area versus sample hydrocarbon concentration for various hydrocarbon molecules.
Figure 3:
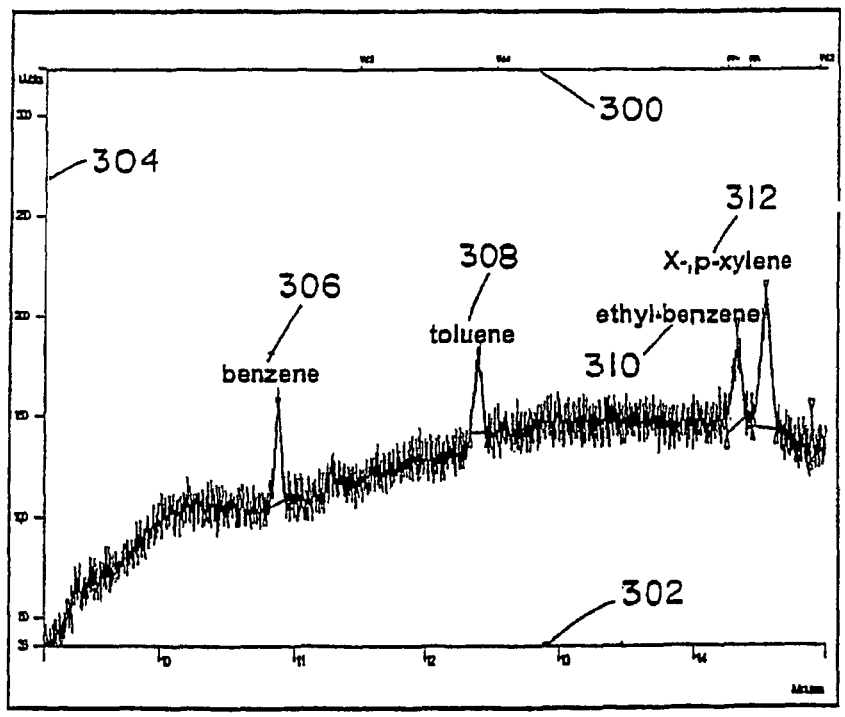
FIG. 3 is a graph of gas chromatograph detector signal versus time for a sample containing 1 ppt each of various hydrocarbon components.

Purging of contaminants is required in many applications. For example, the practice of purging UHP components and gas delivery systems in fabs has been common for many years. Purging and cleaning of equipment and substrates is also required in a number of other fields including, but not limited to, microelectronics, aerospace, optics for cleaning equipment such as LCD substrates, nanostructure surfaces, wafers, reticles and optical assemblies. The disclosed methods are generally applicable for use in these fields. Historically, highly purified nitrogen and argon (less than 1 ppb oxygen, water vapor, CO, $CO_2$, and hydrocarbons) have been used as purge gases during the "dry down" of these components. The "dry down" process has been so named because the main purpose of the purging with nitrogen or argon was to remove adsorbed surface impurities such as water and oxygen.

Purge gases are typically inert. Removal of contaminants by a purge gas may occur by different mechanisms. During the purge process, contaminants diffuse into the purge gas and are carried away in the flow of the gas stream by reaching an equilibrium between the contaminant concentration in the purge gas and on the surfaces. This requires large volumes of UHP gases sufficiently clean to absorb contaminants at very low levels, typically ppb.

Contaminant species adsorbed onto surfaces (e.g., silicon or stainless steel) can also be desorbed by a kinetic effect. This takes place when a purge gas at high flow rate bombards the surface and collides with the adsorbed species. Kinetic energy may be transferred during the collision which can lead to desorption. In the above processes, there is nothing to prevent contaminants from readsorbing to the surfaces.

While not being bound by theory, it is believed that the present invention provides a new paradigm for purging contaminants from electropositive surfaces (e.g., certain plastics, silicon and stainless steel). It is proposed that in addition to the kinetic effect, non-inert molecules such as oxygen and water can exhibit a chemical effect. This is where oxygen and water because of their electronegative and polarized nature, respectively, have a strong affinity for the electropositive surface of the surface and form a weakly bound, absorbed thin layer. In addition, the collision of oxygen with a hydrocarbon may lead to a polarized intermediate, in which the hydrocarbon's affinity for a metal surface is weakened and the hydrocarbon can be more readily be purged. Once a collision leads to desorption, re-adsorption of the contaminant species is hindered by the oxygen thin layer. In the case of water, which forms stronger surface bonds, the thin layer is even more rigid and prevents readsorption. Nitrogen is less capable of such protective behavior because it is less electronegative than oxygen, and the thin layer is very weakly bound and less effective. In addition, $N_2$ is lighter than $O_2$; therefore, it has less of a kinetic effect at the same velocity. This proposed mechanism is not a limitation of the instant invention.

In the instant invention, the effective concentration of oxygen can vary over a wide range, as explained below. The nominal concentration of 17 to 21% oxygen, corresponding to that found in ordinary air, is included in this effective concentration range, solving both the issue of cost and the asphyxiation hazard. Furthermore, these oxygen containing purge gas mixtures can be purified to a high degree, resulting in contaminant levels in the low ppt range. The purification processes known in the current art (generally for purifying oxygen) can be applied to the purification of clean dry air (CDA), a common reagent found in most industrial fab plants, or other oxygen mixtures. Purified air for use in the present invention (i.e., containing less than about 1 ppb contaminants, particularly less than 100 ppt contaminants, such as less than about 10 ppt contaminants, for example, less than about 1 ppt contaminants) will be referred to as XCDA (extra clean dry air, XCDA is a registered trademark of Mykrolis Corporation) to clearly distinguish it from CDA, a term commonly used in the art to refer to air with up to 100 ppm contaminant, typically 10-20 ppm contaminant. Purifiers for the preparation of XCDA are manufactured, for example, by Aeronex, Inc., of San Diego, Calif. (e.g., the OPTICS™ Gas Purifier Series of GateKeeper® purifiers; particularly the O-series), now part of Mykrolis Corporation of Billerica, Mass. Methods for preparation of oxygen and oxygen containing gases to sufficient levels of purity are well known to those skilled in the art (e.g., see U.S. Pat. No. 6,391,090, incorporated herein by reference). Use of a purifier and in situ purification are not required if a commercial source of purge gases is sufficiently pure for the intended application. The concentration of contaminants in a purge gas can be measured by a suitably sensitive technique, such as the PAC™ Parts-Per-Trillion Analyzer Cart marketed by Aeronex. Typically, such techniques involve collecting contaminants from a gas stream over or within a cold trap for an amount of time sufficient to allow a trace contaminant to accumulate to levels that can be accurately quantified with available instrumentation after re-volatilization of the gas.

The oxygen-containing purified gas mixture is comprised of oxygen in a concentration between 99 volume % and 0.0001 volume %, preferably between 25 volume % and 0.1 volume % (e.g., between 25 volume % and 1 volume %), and more preferably between 21 volume % and 1.0 volume %. Additionally, the purge gas optionally contains water vapor at 100 ppm to 2 volume %, preferably 100 ppm to 0.5 volume %. The remainder of the mixture should be an inert gas chosen from among the group of nitrogen, argon, the noble gases, carbon dioxide, and methane. Preferably, nitrogen should be the major inert component, with all other components of the inert gas being present at below about 1 volume %. Preferably, the levels of non-methane hydrocarbons, volatile bases, volatile acids, refractory compounds, and volatile metal compounds should be below 1 ppb. Preferably, the levels of contaminants should be below 100 ppt, more preferably below 10 ppt, most preferably below 1 ppt. The specific purification means is well known to those skilled in the art.

The effective concentration of water in the purge gases of the instant invention, when present, may vary from about 100 ppm to about 2 volume % in the apparatus to be purged, typically no more than 0.5 volume %. Other components of the purge gas (e.g., oxygen, inert gases) are as described immediately above for oxygen-containing purge gases. Theoretically, higher water concentrations can be used; however, it can be impractical to remove such high concentrations from an apparatus before use. Because oxygen and water have been historically considered impurities, their use for removal of contaminants is unexpected. It shall be shown that not only are oxygen and/or water mixtures as effective as UHP nitrogen for removing hydrocarbons from surfaces, they actually show improved performance.

The purging methods disclosed herein can be carried out over a wide range of temperatures. Typically, the methods are carried out at temperatures between ambient temperature (about 20° C.) and 50° C. Nevertheless, the methods optionally can be carried out at temperatures of up to about 100° C. or even 150° C. The temperature is typically selected based upon criteria including thermal tolerance of the components to be cleaned, the volatility of the contaminants at various temperatures and the temperatures that the components (e.g., silicon wafers) will be subjected to during subsequent steps of the manufacturing process.

Figure 4:
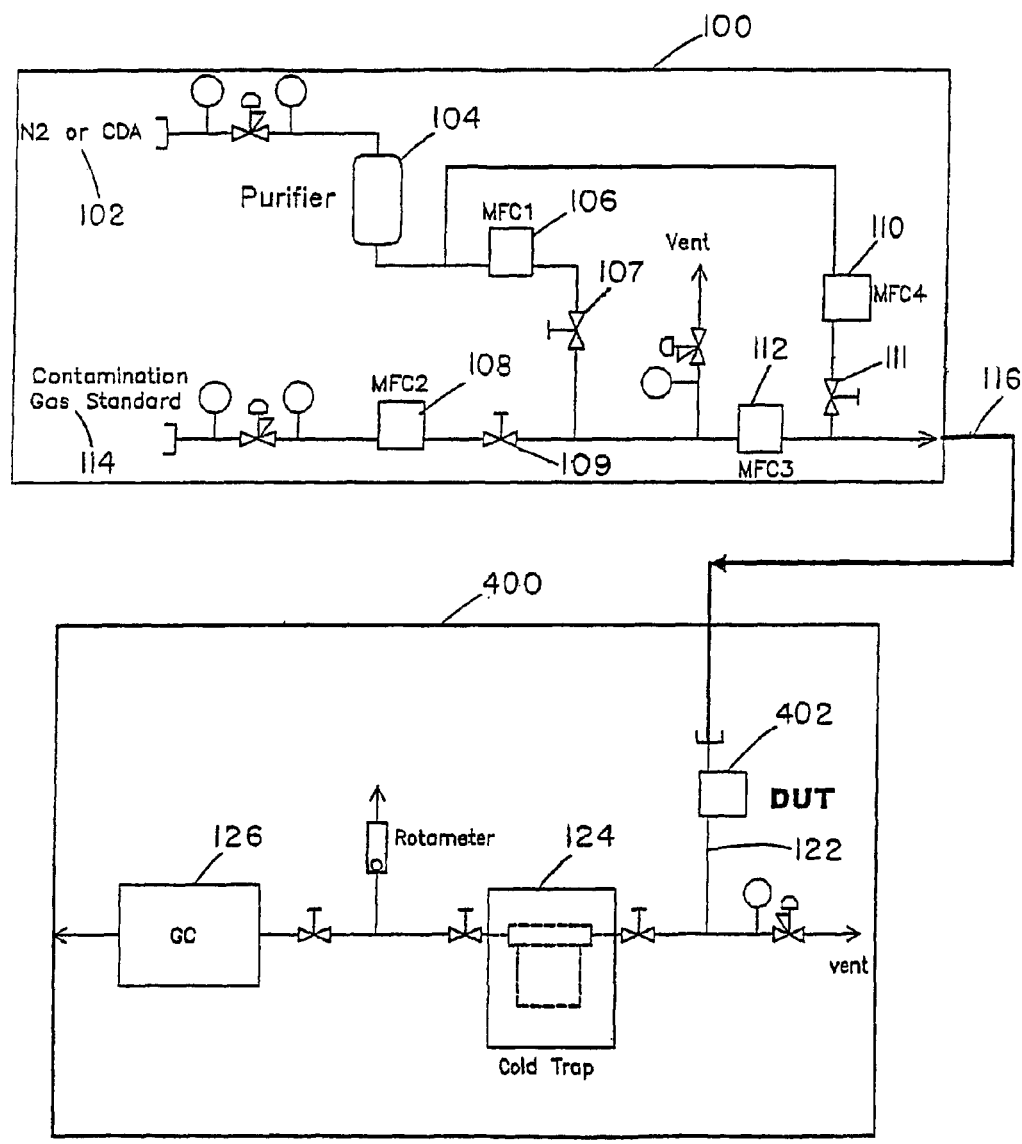
FIG. 4 is a schematic flow diagram of a testing setup according to an embodiment of the present invention.

FIG. 4 is a schematic flow diagram of a testing setup according to an embodiment of the present invention. A double dilution system 100 as described previously is utilized to create known hydrocarbon concentrations from gas standard 114. Concentration curves for other contaminants can be similarly established using methods well known to those skilled in the art. Nitrogen, XCDA, or other oxygen containing mixtures are fed to the carrier input 102. When producing a hydrocarbon mixture to contaminate the surfaces of a test device, nitrogen is chosen at input 102, the hydrocarbon component concentrations being determined by mass flow controllers 108-110 and the concentration of hydrocarbons in gas standard 114. When the purging performance of the purge gas is being evaluated, either nitrogen or a mixture of nitrogen and oxygen are chosen at input 102, with valve 109 closed and valves 107 and/or 111 open. Purifier 104 purifies the nitrogen or nitrogen-oxygen mixtures. The gas mixtures created by system 100 are directed to the device under test (DUT) 402. The hydrocarbon concentrations leaving the DUT 402 are introduced into the input 122 of the gas chromatograph gas analysis system 400, where the hydrocarbon levels can be measured, as previously described and known to those skilled in the art.

Generally, the purging effectiveness of the oxygen mixtures was determined by first purging a test device with a hydrocarbon mixture in nitrogen to saturate the surfaces with hydrocarbons, then removing the hydrocarbons in the gas, and continuing the purging process with either UHP nitrogen or purified oxygen mixtures, and measuring the hydrocarbon concentrations in the gas leaving the DUT. The faster the hydrocarbon concentration drops in the gas exiting the DUT, the more effective the purging process.

Figure 5:
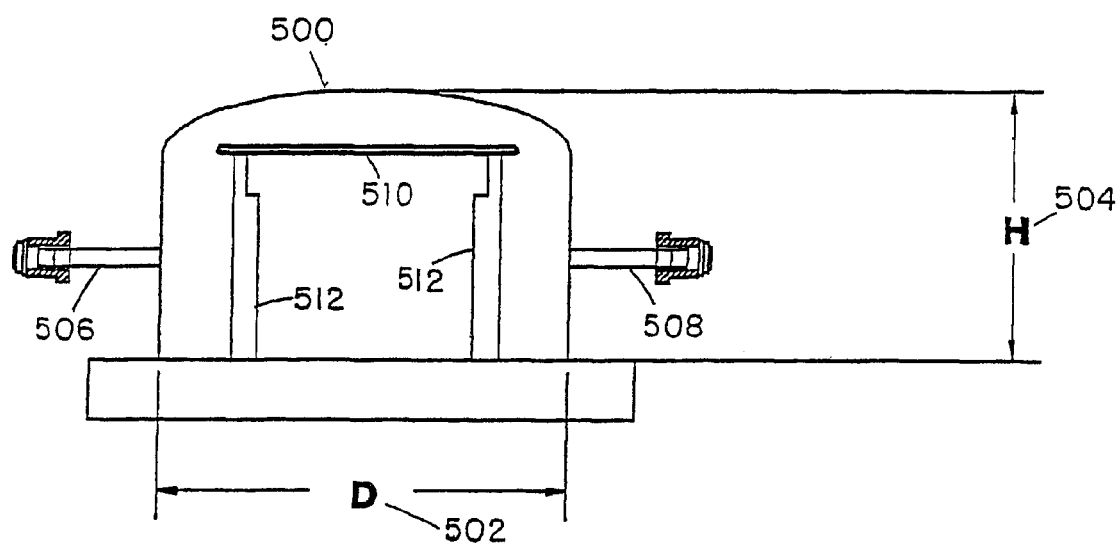
FIG. 5 is a cross section schematic view of a wafer chamber according to an embodiment of the present invention.

FIG. 5 is a cross section schematic view of a wafer chamber 500 according to an embodiment of the present invention. The wafer chamber is used to evaluate the effectiveness of purging hydrocarbons from stainless steel and silicon surfaces. The chamber has an inlet port 506, an outlet port 508, and supports 512 to hold 100 mm diameter silicon substrate 510 in the purge gas environment. The internal surfaces of the wafer chamber are electropolished 316 stainless steel. The wafer chamber diameter D (ref 502) was 6.0 inches, having a height dimension H (ref 504) of 3.9 inches. Wafer chamber 500 was connected as the DUT 402 in the system shown in FIG. 4.

Figure 6:
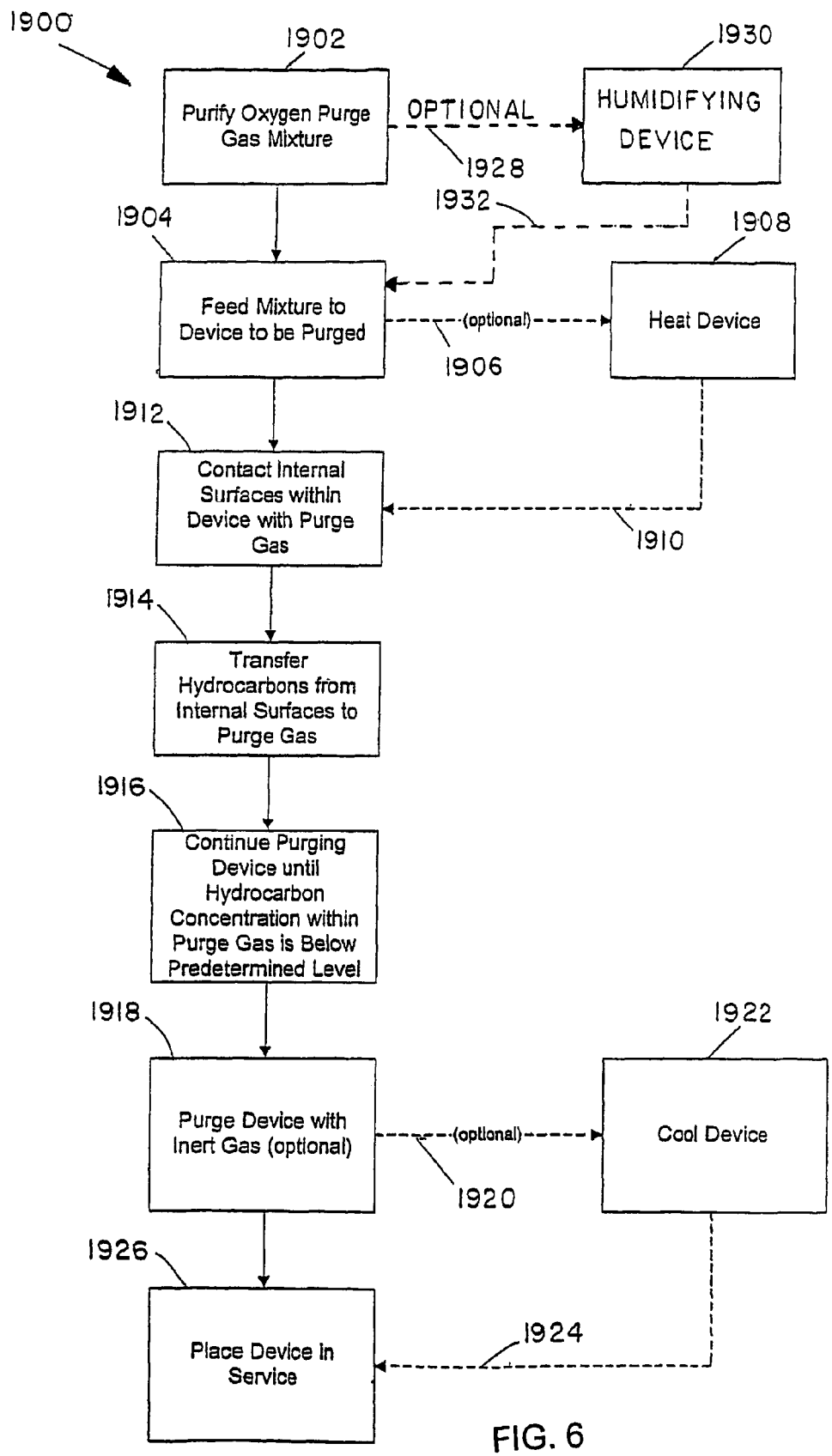
FIG. 6 is a process block diagram of a first purging process according to an embodiment of the present invention.

FIG. 6 is a process block diagram 1900 of a first purging process according to an embodiment of the present invention. The process begins with step 1902, wherein a purge gas mixture containing oxygen is purified. Moisture, when added, is typically added to the oxygen containing gas mixture after purification with step 1928 by passage through a humidifying device 1930. Alternatively, the purge gas contains moisture, but no oxygen. Moisture may be added by any method known to those skilled in the art (e.g., a bubbler). However, methods that allow careful control of the amount of moisture added are preferred. A number of types of calibrated tubing with defined water permeabilities are known to those skilled in the art and are commercially available. Tubes are made of nylon, silicon, Teflon® (poly(ethylene tetrafluoride); PTFE) and Nafion® (Dupont). The purified purge gas is passed through a chamber through which the tubing containing ultrapure water (less than 1 ppb contaminants) runs. The amount of moisture entering the purified purge gas can be determined for a specific flow rate of both water and purge gas. Such methods are well known to those skilled in the art. The humidified purge gas is delivered to the device in step 1932.

In step 1904, the purified purge gas containing oxygen and/or water is fed to the device to be purged. Optionally, the device may be heated in step 1908 to reduce the purge time. If heating is employed, the process proceeds along paths 1906 and 1910 to step 1912. In step 1912, a portion of the internal surfaces are contacted with the oxygen and/or water containing purge gas. In step 1914, a portion of the contaminants present on the internal surfaces of the device are transferred to the purge gas, creating a contaminated purge gas. Surfaces contained within the device being purged may be metal, metal oxides, intermetallics, silicon, silicon oxides, ceramics, nitrides and/or plastics. Preferably, the surfaces are electropolished stainless steel, silicon, and oxides of silicon. Also in step 1914, the contaminated purge gas is removed from the device. In step 1916, the purging process is continued until the contaminant concentration in the purge gas is below a predetermined limit. This limit may be less than 1 ppb, preferably less than 100 ppt, more preferably less than 10 ppt, most preferably less than 1 ppt. In a preferred optional step 1918, an oxygen and water containing purge gas or water containing purge gas is removed by purging with a dry gas including oxygen, nitrogen or other inert gas to remove the water, which is incompatible with a number of high purity applications. In another preferred optional step 1918, an oxygen containing purge gas is removed by purging with nitrogen or another inert gas, if the device is to be placed into service where oxygen is considered undesirable. These optional steps 1918 are preferably conducted while the device is heated. If the device was heated, the device should be cooled in step 1922 and returned to service in step 1926 via paths 1920 and 1924.

Figure 7:
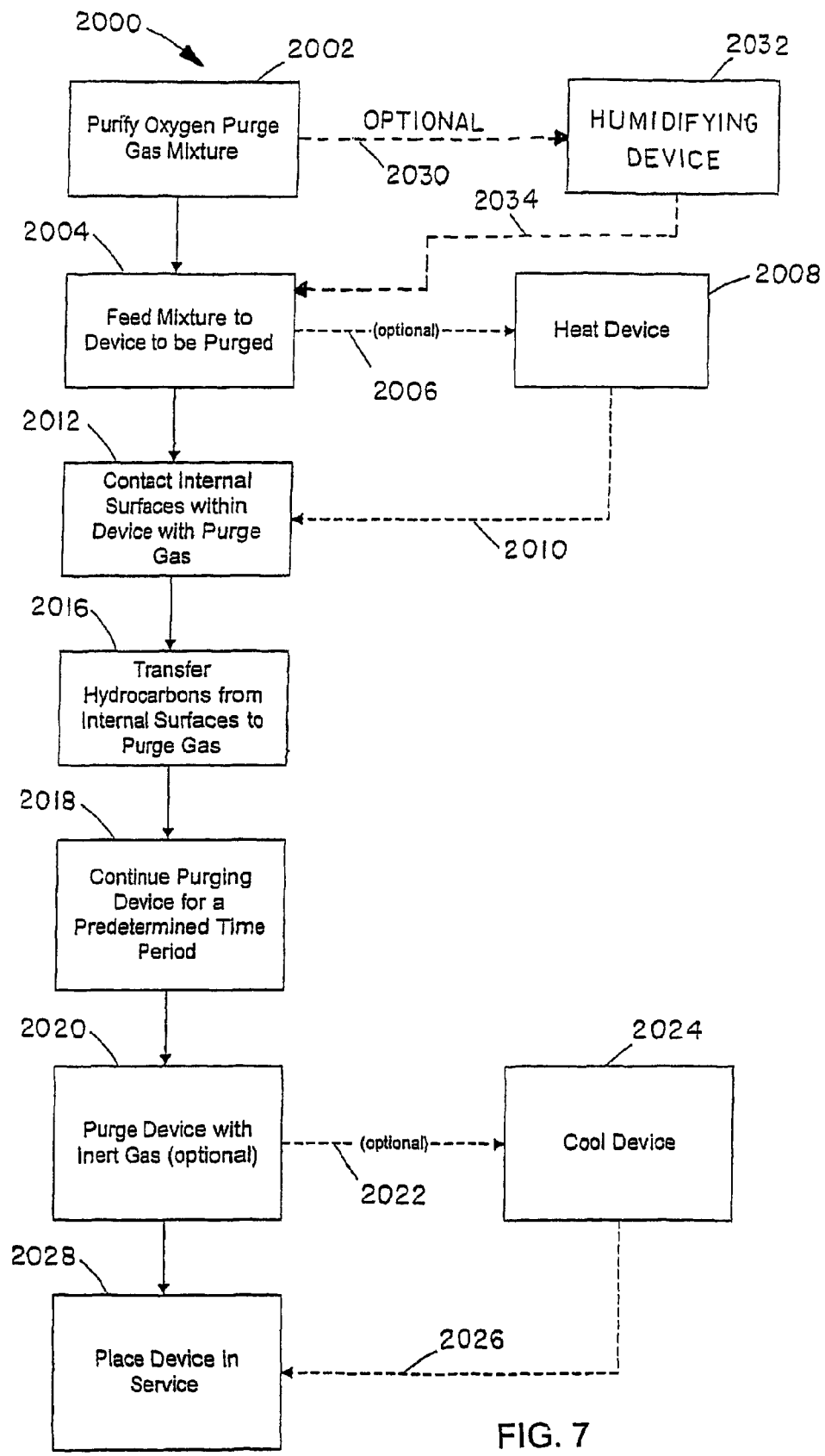
FIG. 7 is a process block diagram of a second purging process according to an embodiment of the present invention.

FIG. 7 is a process block diagram 2000 of a second purging process according to an embodiment of the present invention. The process begins with step 2002, wherein a purge gas mixture containing oxygen is purified. The requirements for the inert gas are as described above. Purification means to obtain such high purity gases are well known to those skilled in the art. In step 2004, the purified purge gas containing oxygen is optionally fed, in step 2030, to a humidifying device 2032 and returned in step 2034 to be fed to the device to be purged. Alternatively, the purified purge gas is humified, but contains no oxygen. Optionally, the device may be heated in step 2008 to reduce the purge time. If heating is employed, the process proceeds along paths 2006 and 2010 to step 2012. In step 2012, a portion of the internal surfaces are contacted with the oxygen and/or water containing purge gas. In step 2016, a portion of the contaminants present on the internal surfaces of the device are transferred to the purge gas, creating a contaminated purge gas. Surfaces contained within the device being purged can be metal, metal oxides, intermetallics, silicon, silicon oxides, ceramics, nitrides and/or plastics. Preferably, the surfaces are electropolished stainless steel, silicon, and oxides of silicon. Also in step 2016, the contaminated purge gas is removed from the device. In step 2018, the purging process is continued for a predetermined time period. This may be more convenient than basing the purge time on the measurement of contaminant concentration, which requires complex and sensitive analytical equipment. In a preferred optional step 2020, an oxygen and water containing purge gas or water containing purge gas is removed by purging with a dry gas including oxygen, nitrogen or other inert gas to remove the water. If the device is to be placed into service where oxygen is considered undesirable, nitrogen or inert gas should be used for the post-cleaning purge. If the device was heated, the device should be cooled in step 2024 and returned to service in step 2028 via paths 2022 and 2026.

Figure 8:
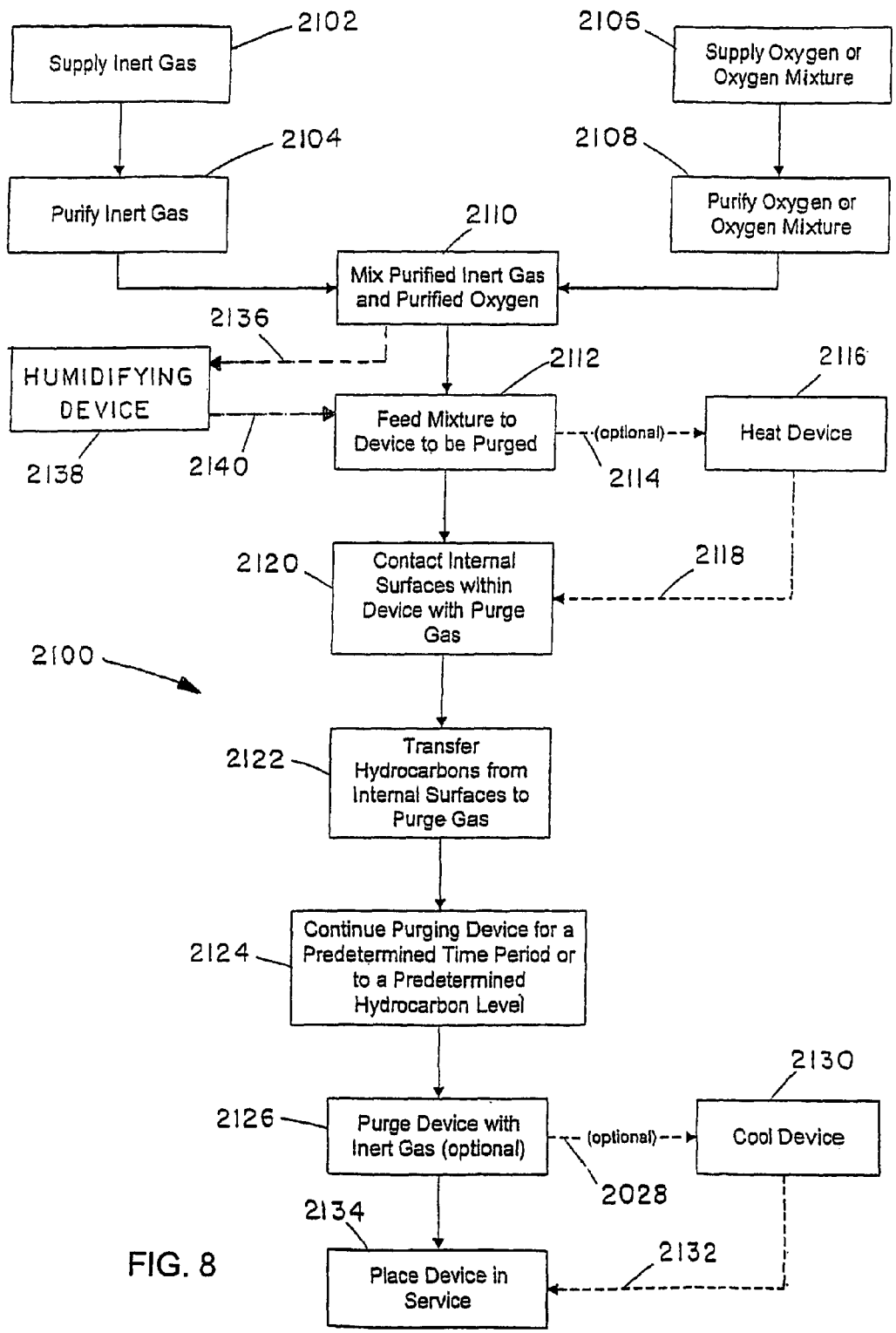
FIG. 8 is a process block diagram of a third purging process according to an embodiment of the present invention.

FIG. 8 is a process block diagram 2100 of a third purging process according to an embodiment of the present invention. In step 2102, an inert gas is supplied. The requirements for the inert gas are as described above. In step 2104, the inert gas is purified via a process or processes well known to those skilled in the art. In step 2106, essentially pure oxygen or a mixture containing oxygen is supplied. In step 2108, the oxygen or oxygen mixture is purified via a process or processes that are well known to those skilled in the art. In step 2110, the purified oxygen or oxygen mixture from step 2108 is combined with the purified inert gas from step 2104. Optionally, the purification stages may be performed after the combining of the gases in step 2110. After step 2110, the purified purge gas containing oxygen is optionally fed, in step 2136, to a humidifying device 2138 and returned in step 2140, so that the purified purge gas containing oxygen and/or water is fed to the device to be purged. Optionally, the device is heated in step 2116 to reduce the purge time. If heating is employed, the process proceeds along paths 2114 and 2118 to step 2120. In step 2120, a portion of the internal surfaces are contacted with the oxygen containing purge gas. In step 2122, a portion of the contaminants (e.g., hydrocarbons) present on the internal surfaces of the device are transferred to the purge gas, creating a contaminated purge gas. Surfaces contained within the device being purged may be metal, metal oxides, intermetallics, silicon, silicon oxides, ceramics, nitrides and/or plastics. Preferably, the surfaces are electropolished stainless steel, silicon, and oxides of silicon. Also in step 2122, the hydrocarbon purge gas is removed from the device. In step 2124, the purging process is continued for a predetermined time period, or to a predetermined hydrocarbon level. This level is typically less than 100 ppt, but is preferably less than 10 ppt. In a preferred optional step 2126, the oxygen and water containing purge gas is removed by purging with a dry gas including oxygen, nitrogen or other inert gas to remove the water. If the device is to be placed into service where oxygen is considered undesirable, nitrogen or inert gas should be used for the post-cleaning purge. If the device was heated, the device should be cooled in step 2130 and returned to service in step 2134 via paths 2128 and 2132.

EXAMPLE 1

The effectiveness of removing hydrocarbons from 316 stainless steel electropolished surfaces with oxygen mixtures is demonstrated in this example. 316 stainless steel electropolished surfaces are widely used in UBP gas distribution systems in mass flow controllers, pressure regulators, and interconnecting pipe and tubing. They are also widely used as a process chamber material in semiconductor manufacturing equipment. An empty (no silicon wafer 510 present) wafer chamber 500, was first purged with a nitrogen-hydrocarbon mixture containing approximately 10 ppb each of benzene, toluene, ethyl-benzene, meta- and para-xylene, and ortho-xylene for approximately 3.5 hours. Following the hydrocarbon exposure, the wafer chamber was purged with UHP nitrogen and the hydrocarbon concentrations in the purge gas exiting the chamber were measured. The hydrocarbon exposure was then repeated. Following the second hydrocarbon exposure, the wafer chamber was purged with purified XCDA, which contained approximately 20% oxygen by volume.

Figure 9:
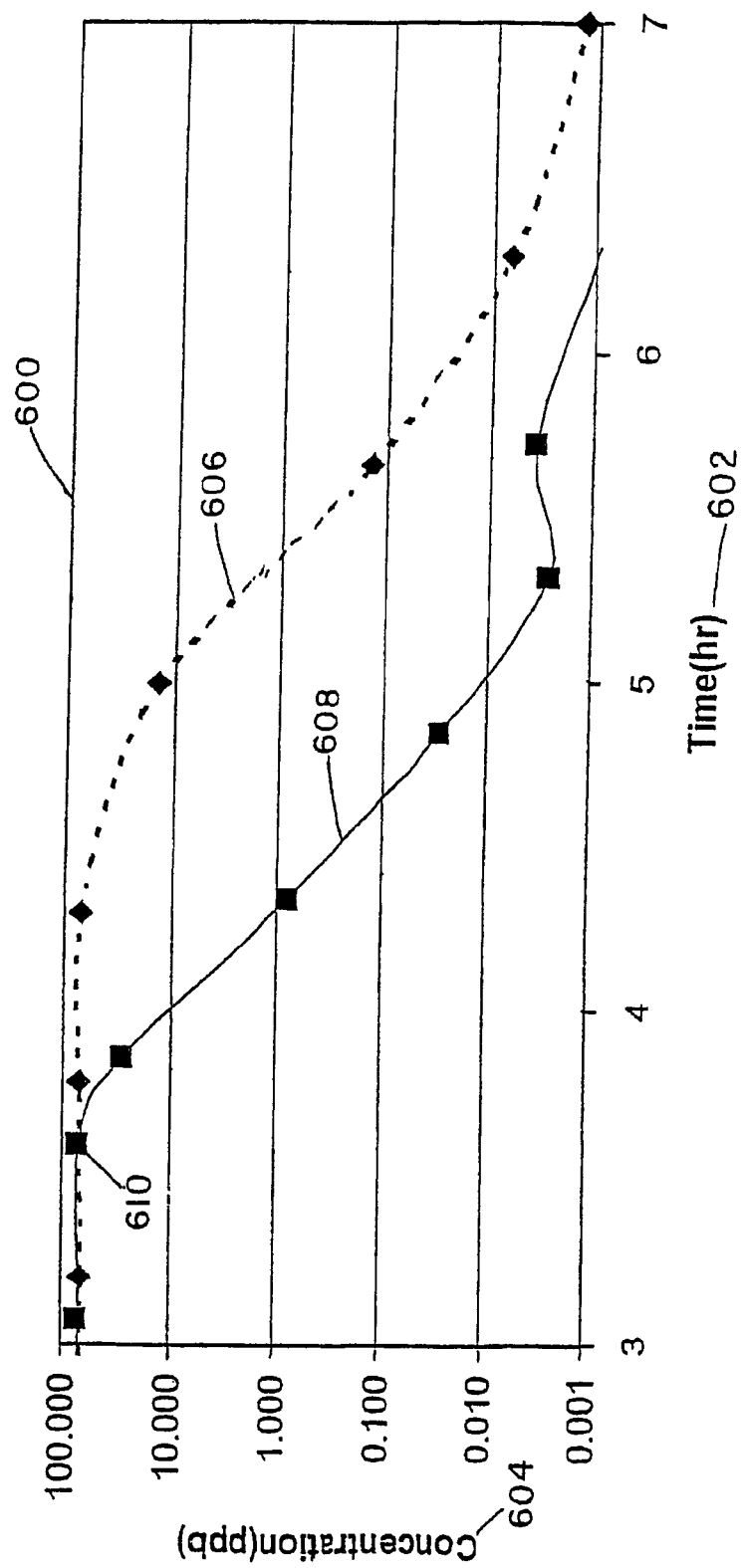
FIG. 9 is a graph of hydrocarbon concentration versus time for two purge gas mixtures exiting the wafer chamber of FIG. 5, with no wafer in the chamber, according to an embodiment of the present invention.

FIG. 9 is a graph 600 of hydrocarbon concentration 604 versus time 602 for two purge gas mixtures exiting the wafer chamber of FIG. 5, with no wafer in the chamber, according to an embodiment of the present invention. Broken curve 606 shows the total concentration decay response of all six hydrocarbons in the purge gas leaving the wafer chamber with a pure nitrogen purge gas. Solid curve 608 shows the total concentration decay response of all six hydrocarbons in the purge gas leaving the wafer chamber with a purified XCDA purge gas. Ref 610 indicates the point where the hydrocarbon containing purge gas was substituted with the nitrogen or XCDA.

The elution times of the hydrocarbons in curves 606 and 608 were compared to the time it would take to dilute the original 60 ppb hydrocarbon concentration to 10 ppt, given the wafer chamber volume of approximately 1.5 liters and purge flow rate of 0.75 liters/min. For a uniformly mixed system, it would take about 8.7 time constants to reduce an initial 60 ppb concentration to 10 ppt. The time constant is defined as the wafer chamber volume divided by the purge flow rate. At a time constant of approximately two minutes, simple dilution would take under 20 minutes to reach 10 ppt from an initial starting point of 60 ppb. The actual time for either the XCDA or pure nitrogen to reach 10 ppt is considerably longer, indicating that removal from the internal stainless steel surfaces is dominating the hydrocarbon elution from the wafer chamber. Other tests have shown that once the hydrocarbons are reduced to very low levels (10 ppt and below) by purified XCDA, subsequent purging by UHP nitrogen does not produce hydrocarbon concentrations above the levels last obtained with the XCDA.

EXAMPLE 2

Figure 10:
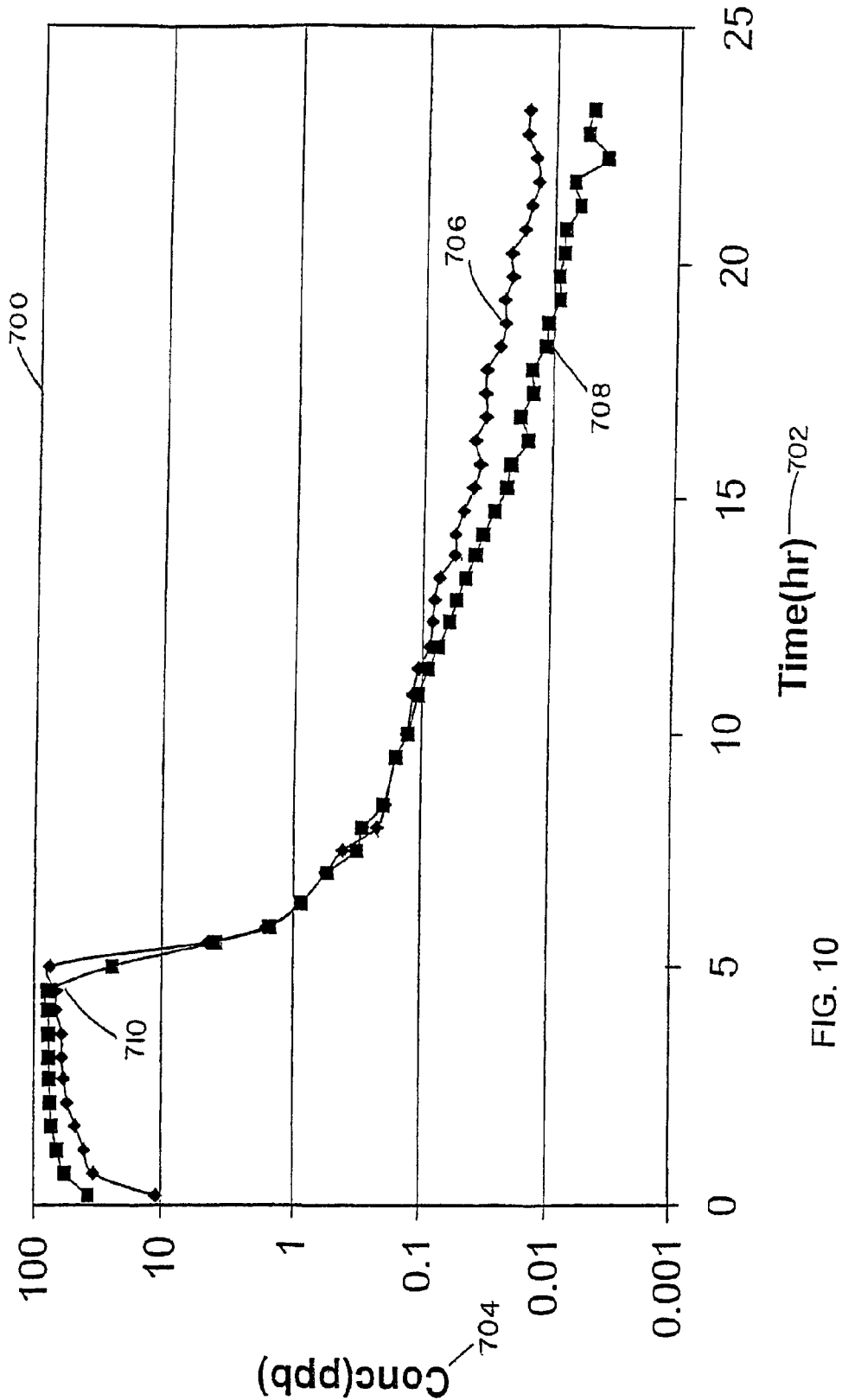
FIG. 10 is a graph of hydrocarbon concentration versus time for two purge gas mixtures exiting the wafer chamber of FIG. 5, with a silicon wafer in the chamber, according to an embodiment of the present invention.
Figure 11:
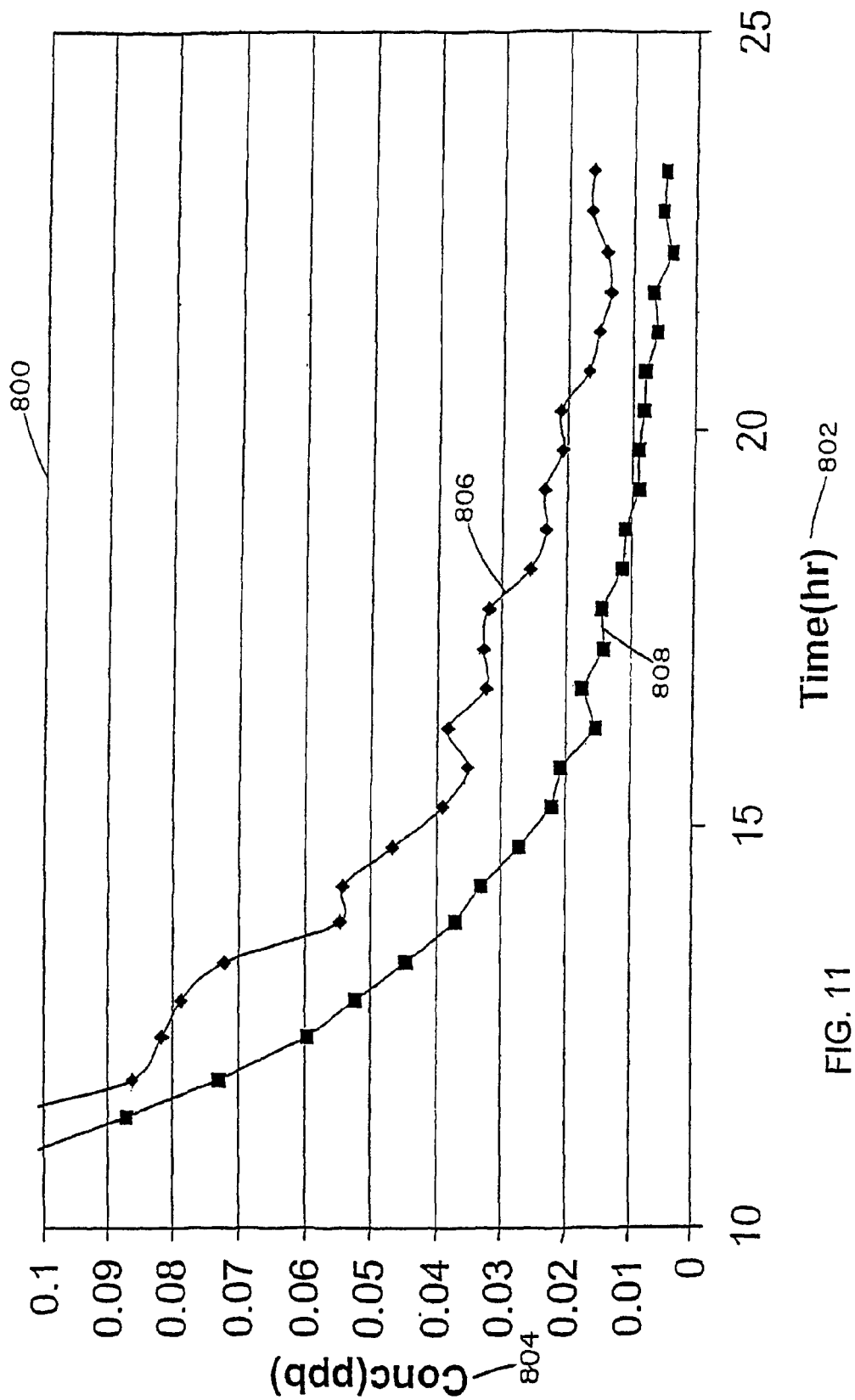
FIG. 11 is an expanded version of FIG. 10, showing the time span from 10 hrs to 25 hrs in greater detail, according to an embodiment of the present invention.

In this example, the test described in Example 1 was repeated, with the exception that a bare 100 mm (4 inch) silicon substrate 510 was placed in the wafer chamber 500 prior to exposure to the nitrogen-hydrocarbon mixture. FIG. 10 is a graph 700 of total hydrocarbon concentration 704 versus time 702 for two purge gas mixtures exiting the wafer chamber of FIG. 5, with a silicon wafer in the chamber, according to an embodiment of the present invention. Curve 706 shows the decay in hydrocarbon concentration while the wafer chamber and wafer are purged with UHP nitrogen. Curve 708 shows the decay in hydrocarbon concentration while the wafer chamber and wafer are purged with purified XCDA. Ref 710 indicates the approximate point where feed of nitrogen-hydrocarbon mixture was terminated. Curves 706 and 708 clearly indicate hydrocarbon removal from silicon substrates is significantly slower than the stainless steel surfaces of the wafer chamber. As in the previous Example 1, the oxygen containing purge gas (curve 708) shows a more rapid reduction in hydrocarbon concentration, when compared to UHP nitrogen (curve 706). FIG. 11 is an expanded version of FIG. 10, showing the time span from 10 hrs to 25 hrs in greater detail. Here it can be more clearly seen from graph 800 that hydrocarbon concentration 804 versus time 802 for the XCDA purge (curve 808) is in advance of the UHP nitrogen curve 806. At the 20 ppt concentration level, the UHP nitrogen response lags the XCDA response by nearly 5 hours. This, of course, means that it would require 5 hours longer to purge the wafer chamber and wafer to the 20 ppt level with UHP nitrogen.

EXAMPLE 3

Figure 12:
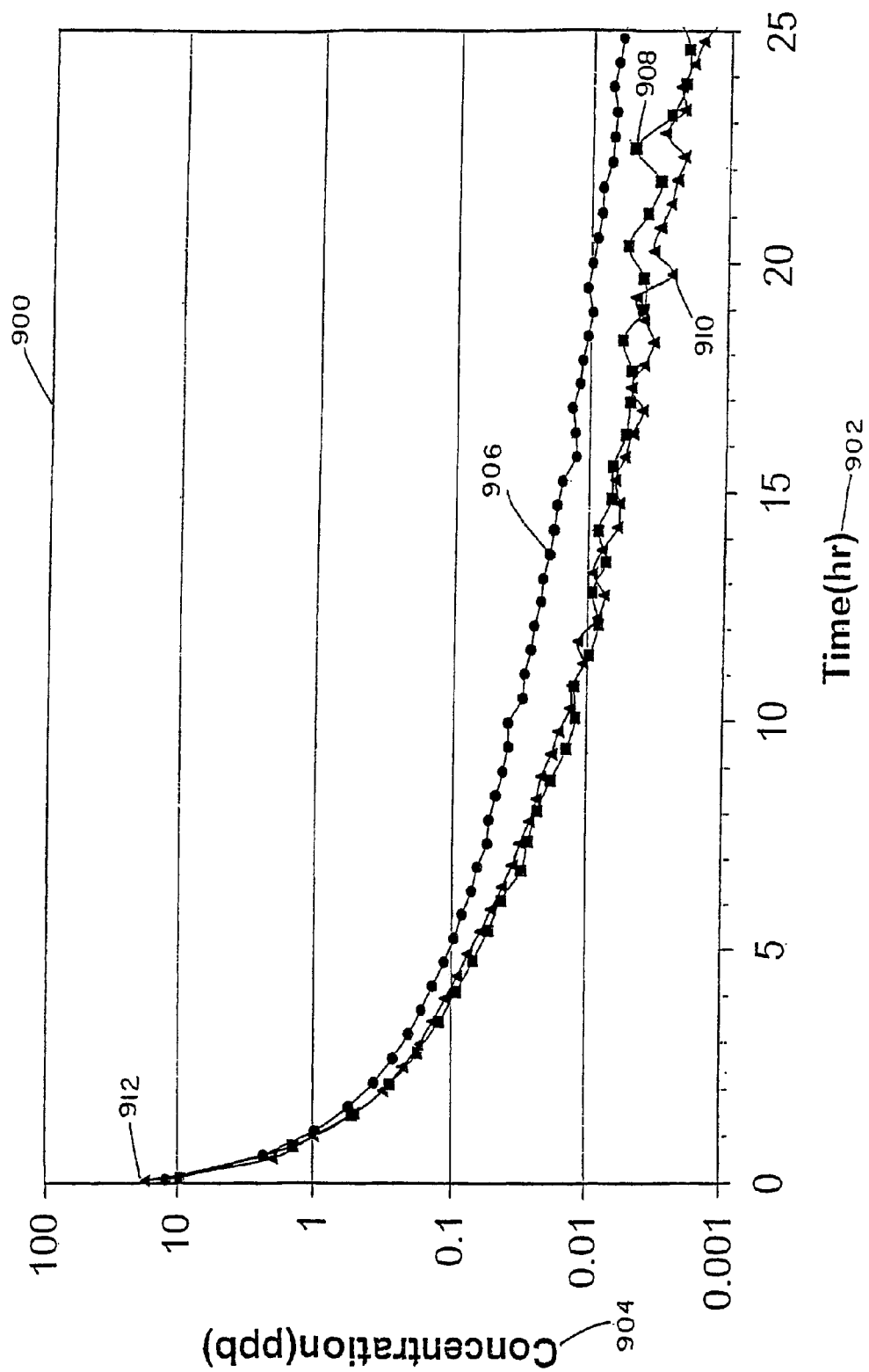
FIG. 12 is a graph of meta- and para-xylene concentration versus time for three purge gas mixtures exiting the wafer chamber of FIG. 5, with a silicon wafer in the chamber, the purge gases containing 0%, 1%, and 20% oxygen, according to an embodiment of the present invention.
Figure 13:
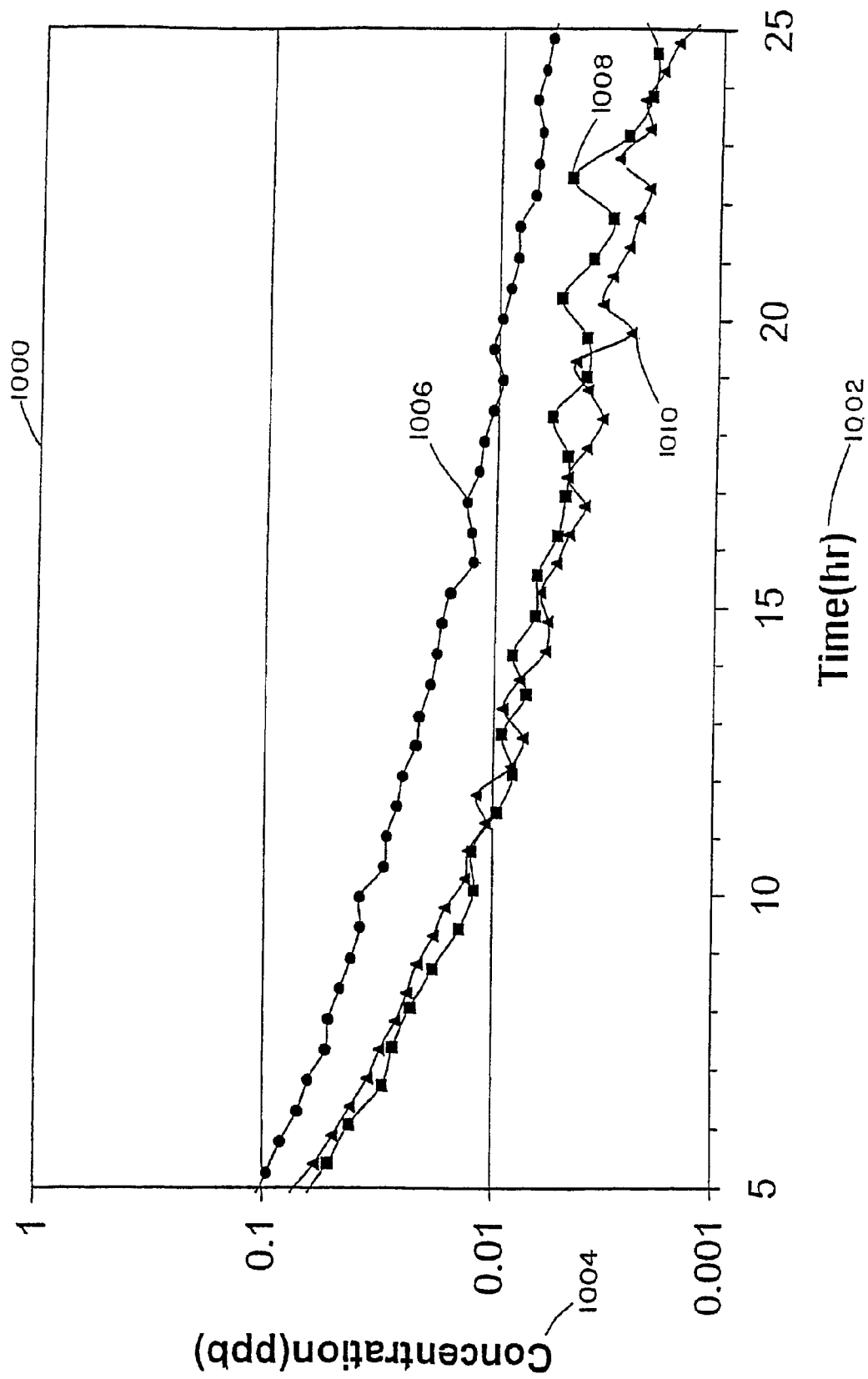
FIG. 13 is an expanded version of FIG. 12, showing the time span from 5 hrs to 25 hrs in greater detail, according to an embodiment of the present invention.

FIG. 12 is a graph 900 of meta- and para-xylene concentration 904 versus time 902 for three purge gas mixtures exiting the wafer chamber of FIG. 5, with a silicon wafer in the chamber, the purge gases containing 0%, 1%, and 20% oxygen, according to an embodiment of the present invention. In this example, 1% oxygen and 20% oxygen (in nitrogen) are compared to UBP nitrogen. The hydrocarbon mixture used was approximately 10 ppb of meta-xylene and 10 ppb of para-xylene in nitrogen. As in Example 2, a silicon substrate was placed in the wafer chamber prior to the hydrocarbon exposure. Curve 906 in FIG. 12 shows the concentration response of both xylenes as a function of time during a UHP nitrogen purge. Curve 908 shows the concentration response of both xylenes as a function of time during a 1% oxygen (by volume) in nitrogen purge. Curve 910 shows the concentration response of both xylenes as a function of time during a 20% oxygen (by volume) in nitrogen (XCDA) purge. Ref 912 indicates the point at which the hydrocarbon feed gas was terminated. FIG. 13 is an expanded version of FIG. 12, showing the time span from 5 hrs to 25 hrs in greater detail. Here it can be more clearly seen from graph 1000 that hydrocarbon concentration 1004 versus time 1002 for the 1% oxygen purge gas (curve 1008) and the 20% oxygen purge gas (curve 1010) is in advance of the UHP nitrogen curve 1006. From a comparison of the three curves 1006-1010, it can be noted that 1% oxygen is as effective as 20% for hydrocarbon levels above 10 ppt, but that the higher oxygen concentration has a slight advantage at levels below 10 ppt. Both oxygen containing purge gases demonstrate a significant advantage over purging with UHP nitrogen.

EXAMPLE 4

Figure 14:
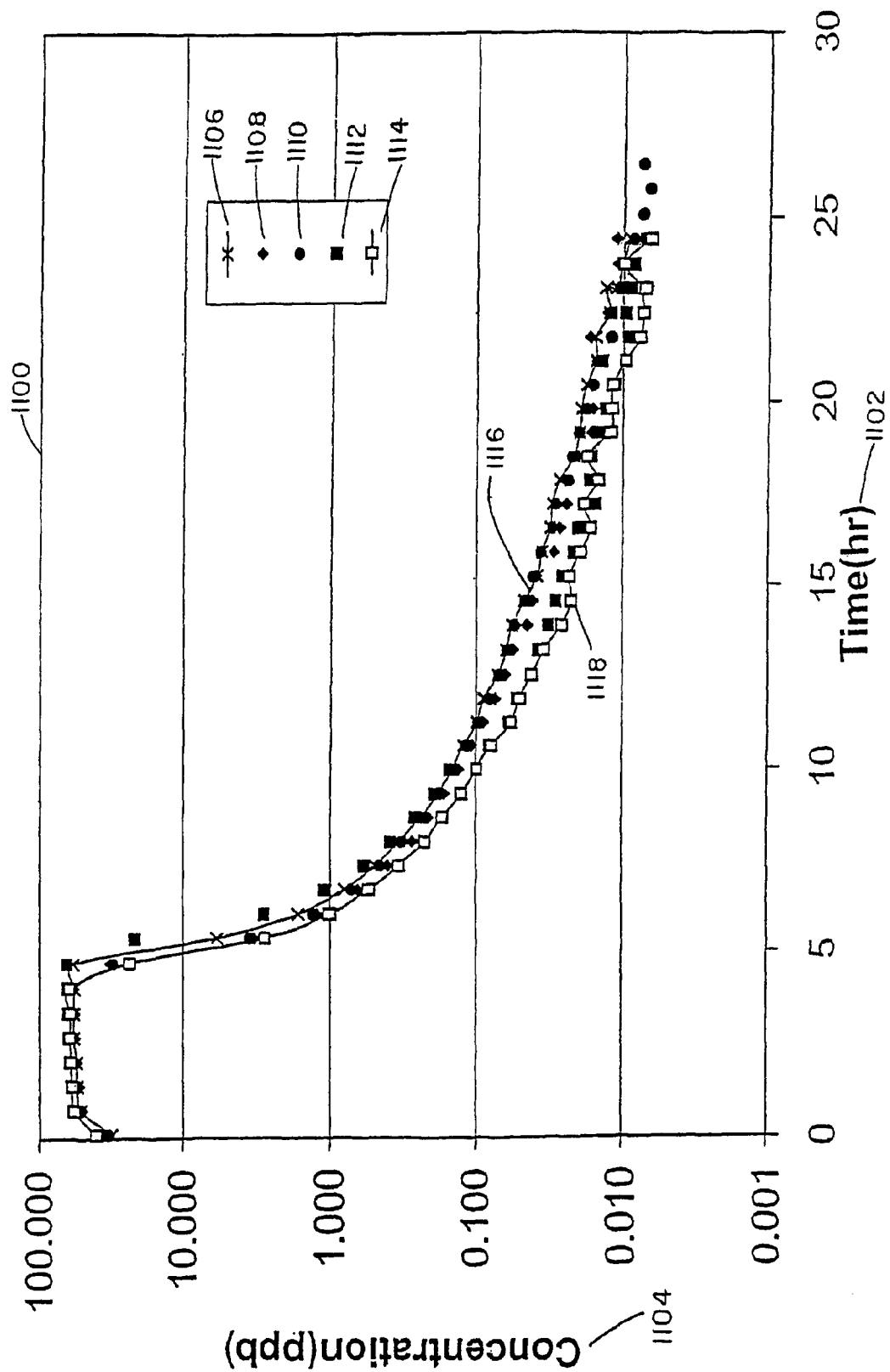
FIG. 14 is a graph of hydrocarbon concentration versus time for five purge gas mixtures exiting the wafer chamber of FIG. 5, with a silicon wafer in the chamber, the purge gases containing 0%, 0.001%, 0.01%, 0.1%, and 1.0% oxygen, according to an embodiment of the present invention.
Figure 15:
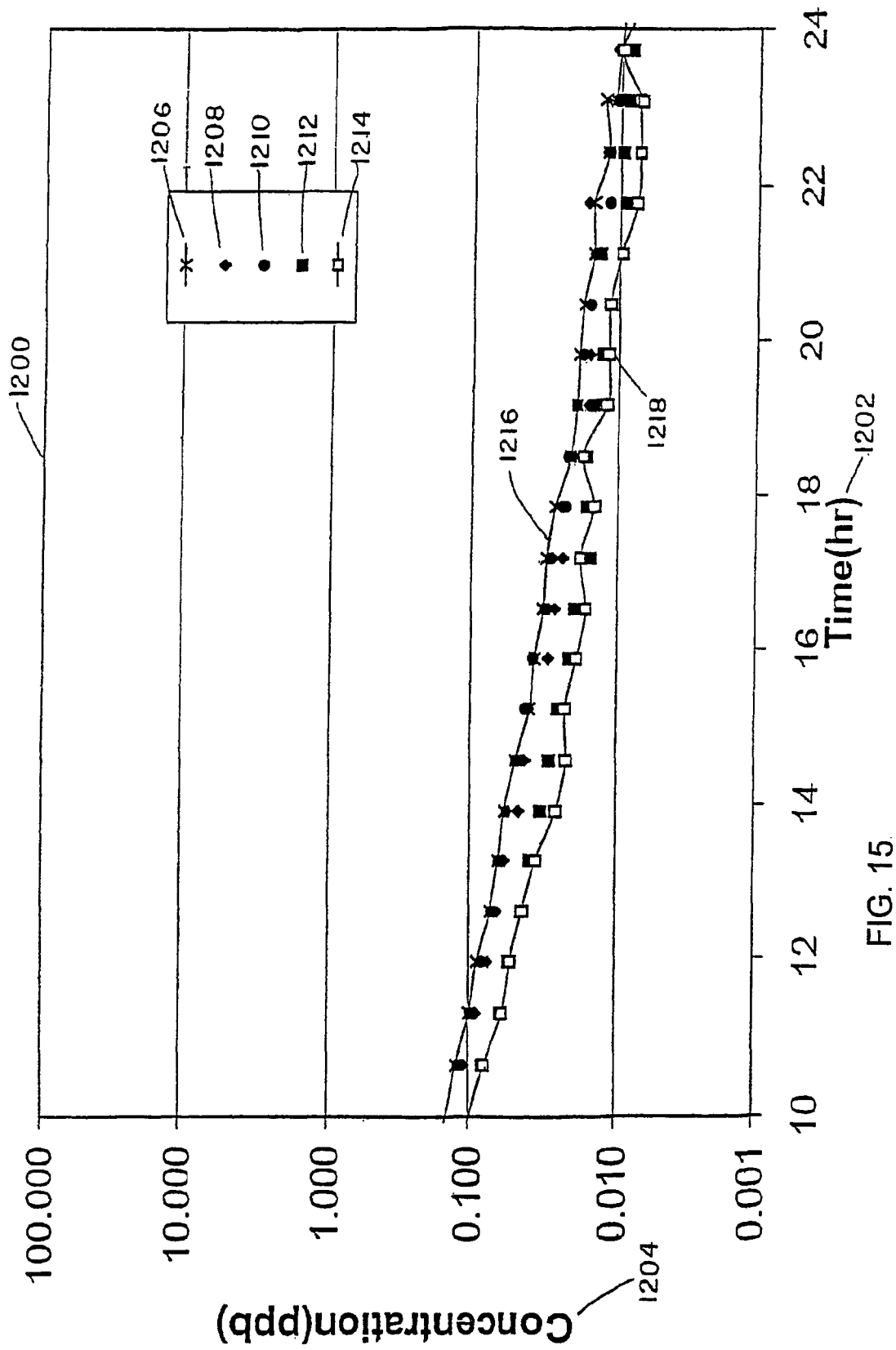
FIG. 15 is an expanded version of FIG. 14, showing the time span from 10 hrs to 24 hrs in greater detail, according to an embodiment of the present invention.
Figure 16:
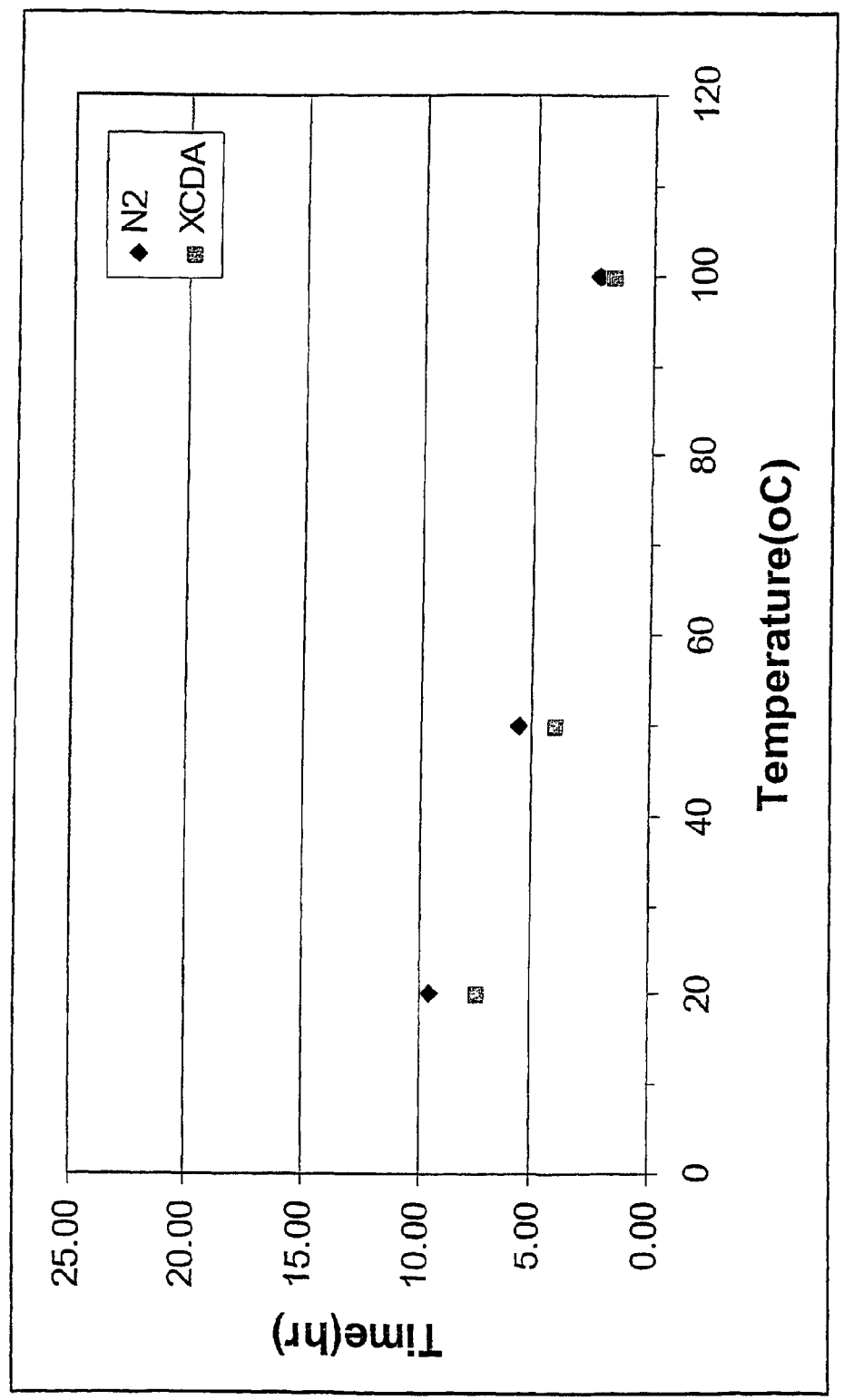
FIG. 16 is a graph of the time required to reduce ethyl benzene levels to 10 ppt using either $N_2$ or XCDA at various temperatures.
Figure 17:
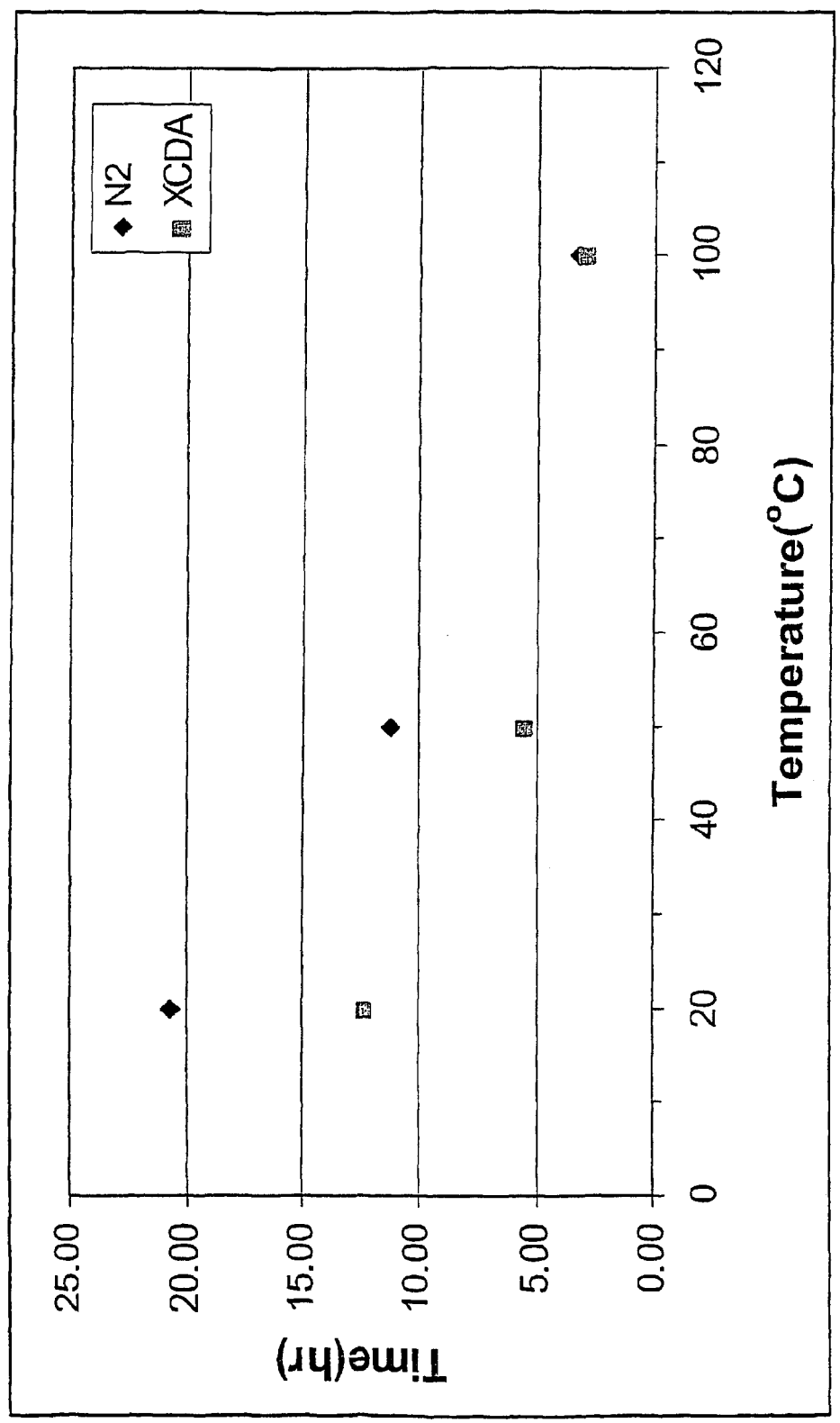
FIG. 17 is a graph of the time required to reduce meta- and para-xylene levels to 10 ppt using either $N_2$ or XCDA at various temperatures.
Figure 18:
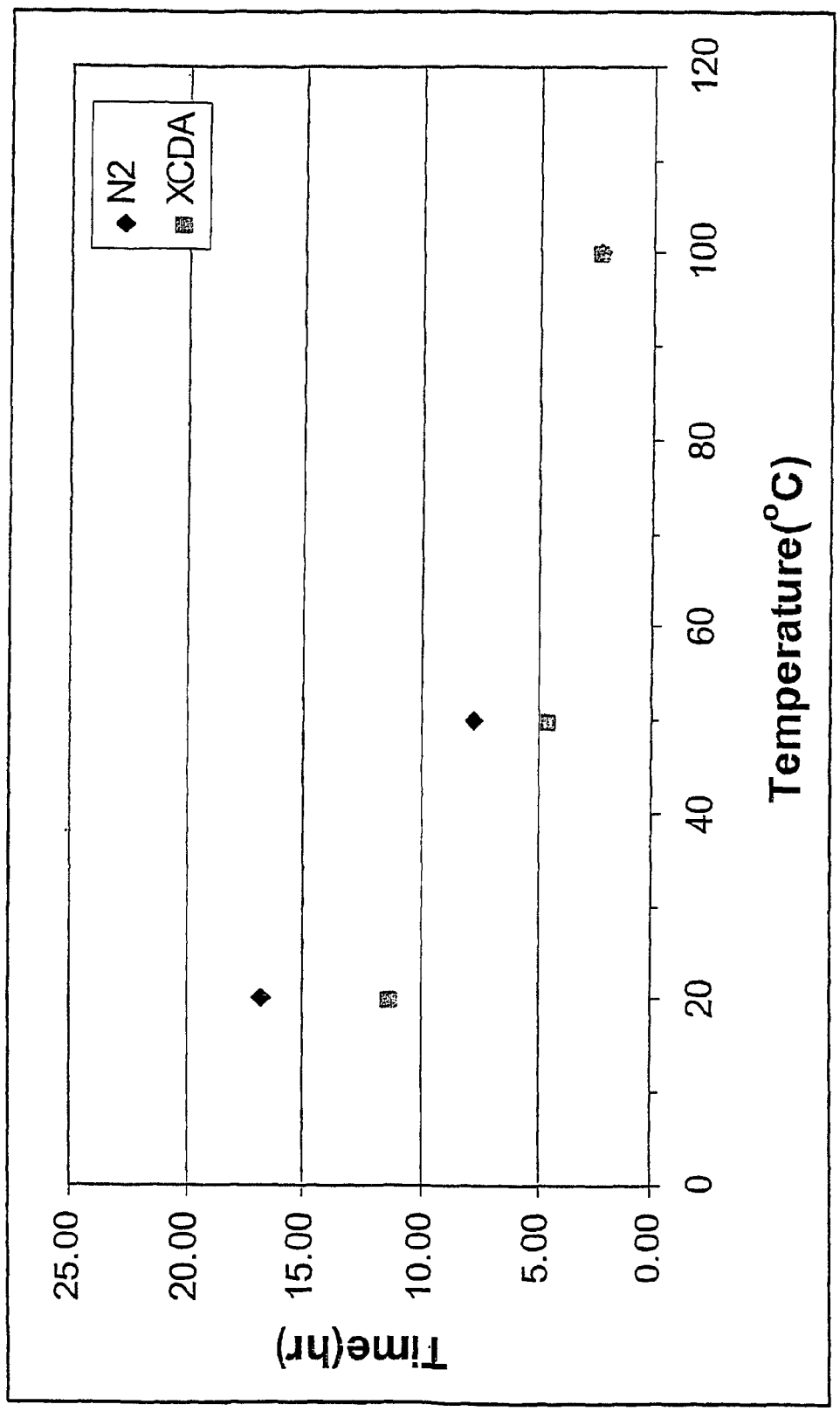
FIG. 18 is a graph of the time required to reduce ortho-xylene levels to 10 ppt using either $N_2$ or XCDA at various temperatures.
Figure 19:
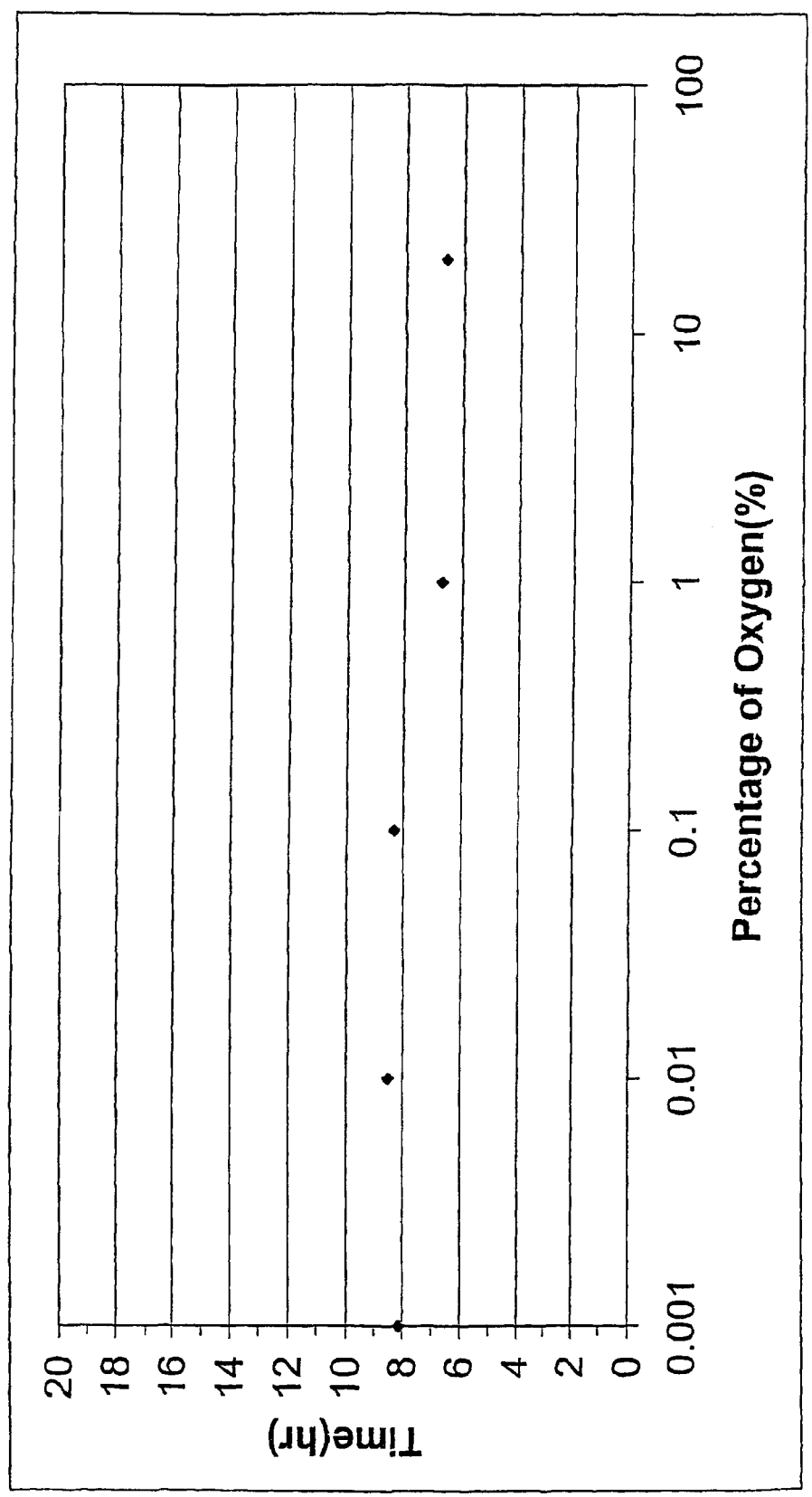
FIG. 19 is a graph of the time required to reduce ethyl benzene levels to 10 ppt at various oxygen concentrations.
Figure 20:
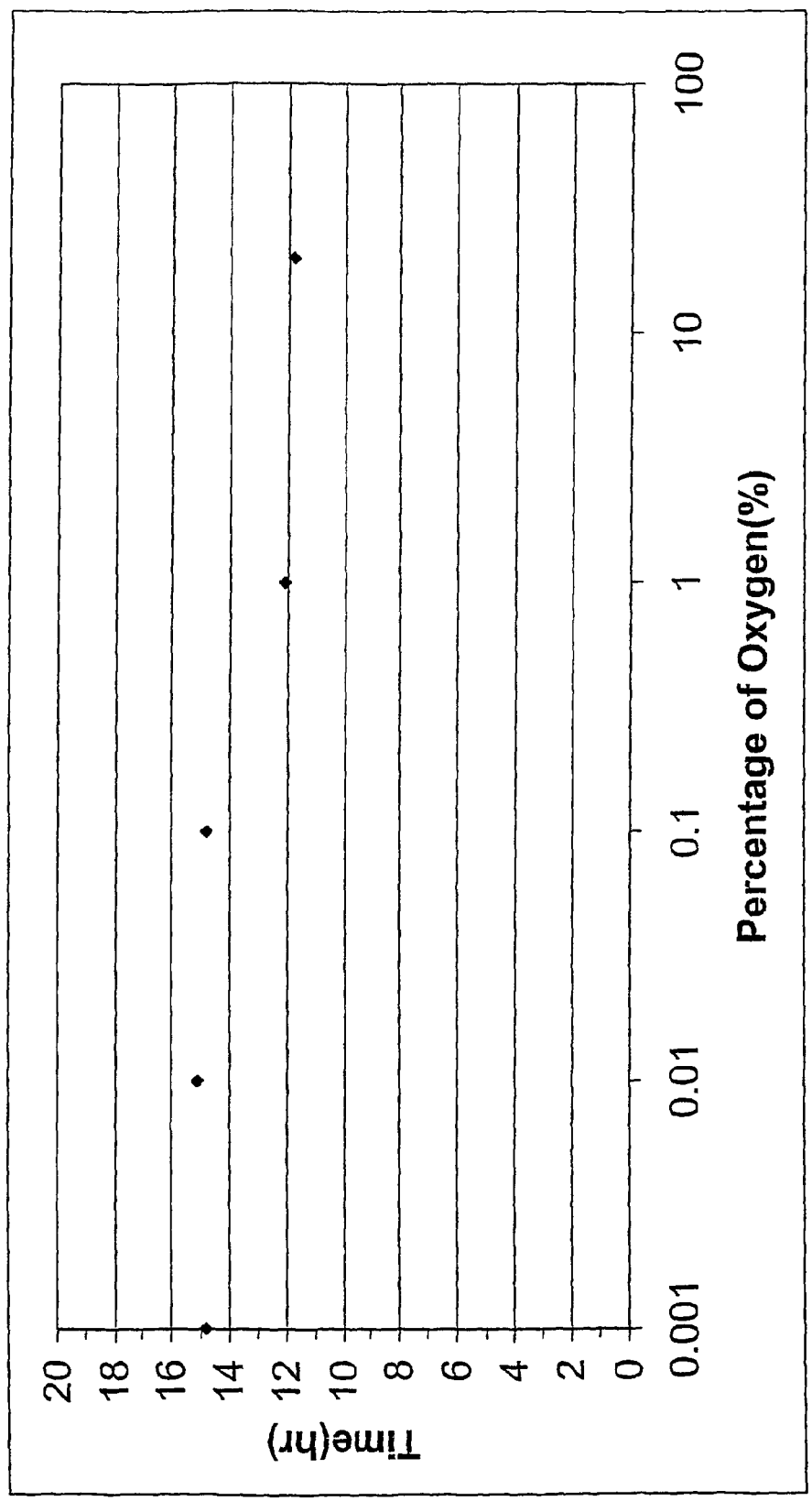
FIG. 20 is a graph of the time required to reduce meta- and para-xylene levels to 10 ppt at various oxygen concentrations.
Figure 21:
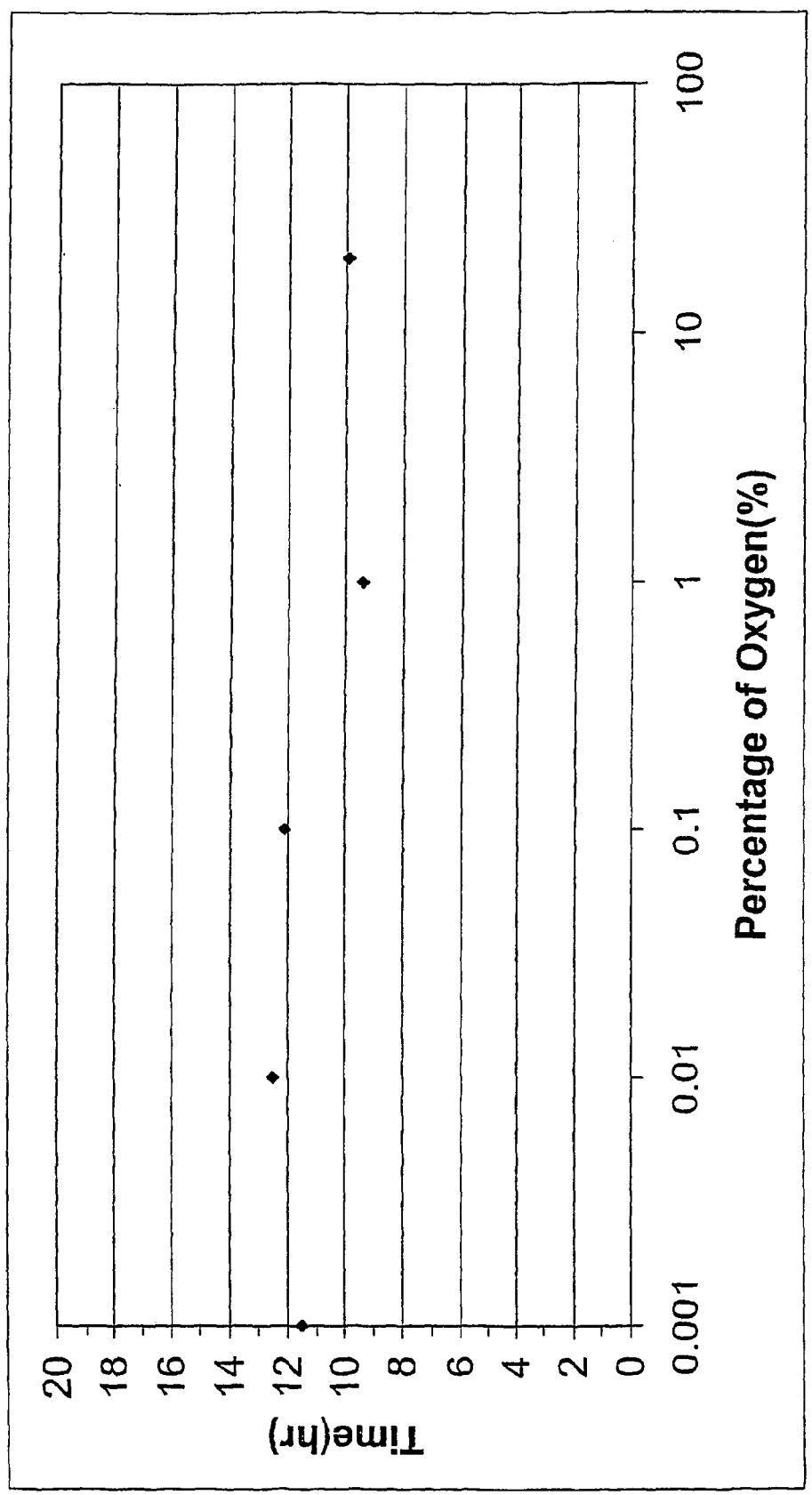
FIG. 21 is a graph of the time required to reduce ortho-xylene levels to 10 ppt at various oxygen concentrations.

FIG. 14 is a graph 1100 of hydrocarbon concentration 1104 versus time 1102 for five purge gas mixtures exiting the wafer chamber of FIG. 5, with a silicon wafer in the chamber, the purge gases containing 0%, 0.0001%, 0.01%, 0.1%, and 1.0% oxygen, according to an embodiment of the present invention. The hydrocarbon-nitrogen contamination mixture was 60 ppb total hydrocarbon concentration, as described in Example 1. Data representing the purge response of UHP nitrogen (ref 1106, curve 1116), 0.0001% oxygen (by volume) in nitrogen 1108, 0.01% oxygen (by volume) in nitrogen 1110, 0.1% oxygen (by volume) in nitrogen 1112, and 1% oxygen (by volume) in nitrogen (ref 1114, curve 1118) are plotted in graph 1100. All the data fall between the 0% oxygen curve 1116 (UHP nitrogen) and the 1% oxygen curve 1118, as might be expected. Purging effectiveness increases as oxygen concentration increases within the ranges of oxygen concentration shown. FIG. 15 is an expanded version of FIG. 14, showing the time span from 10 hrs to 24 hrs in greater detail. The graph 1200 of hydrocarbon concentration 1204 versus time 1202 is plotted with data representing the purge response of UHP nitrogen (ref 1206, curve 1216), 0.0001% oxygen 1208, 0.01% oxygen 1210, 0.1% oxygen 1212, and 1% (ref 1214, curve 1218). See FIGS. 16-21 which show dry-down times versus temperature or concentration.

EXAMPLE 5

Figure 22:
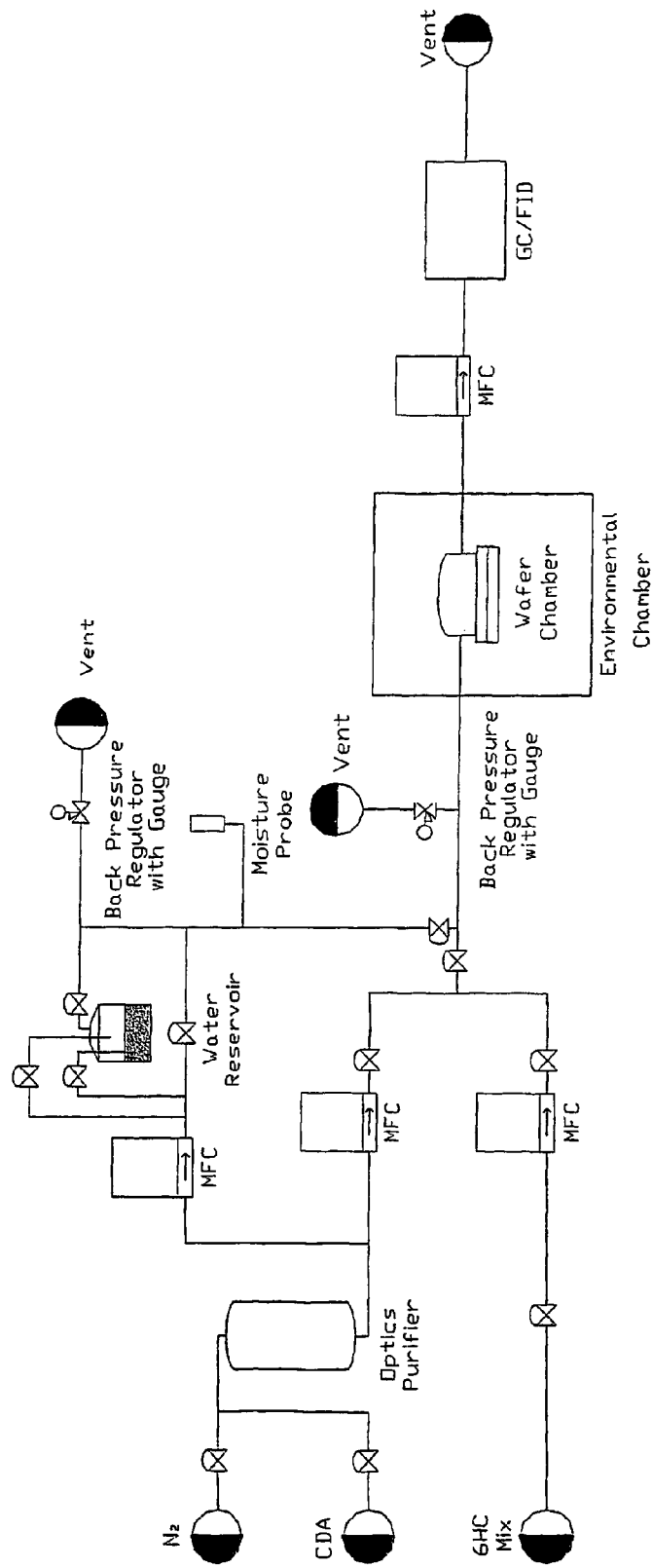
FIG. 22 is a schematic flow diagram for the wet gas purging experiment described in Example 5.

The effectiveness of removing hydrocarbons from 316 stainless steel electropolished surfaces with water mixtures is demonstrated in this example using a method similar to that in Example 1. See FIG. 22. Initially purified nitrogen gas was mixed with a six-component hydrocarbon gas standard (benzene, toluene, ethylbenzene, xylenes; BTEX) to create a known challenge of 60 ppb total organic compounds (TOC). The wafer chamber, housing a wafer, was purged with the challenge gas under standard operating conditions of 0.75 slm, 30 psig and ambient temperature. The wafer chamber effluent was measured for hydrocarbon level using a gas chromatograph with a flame ionization detector until its concentration reached 60 ppb±2 ppb hydrocarbon. The stabilization time for the chamber to condition occurred after 4-5 hours.

After the wafer chamber was saturated with the 60 ppb TOC, the BTEX challenge was turned off and moisture or oxygen was added to the nitrogen gas stream as indicated. The wafer chamber effluent was monitored until its TOC concentration dried down below the 10 ppt level for each contaminant.

Figure 23:
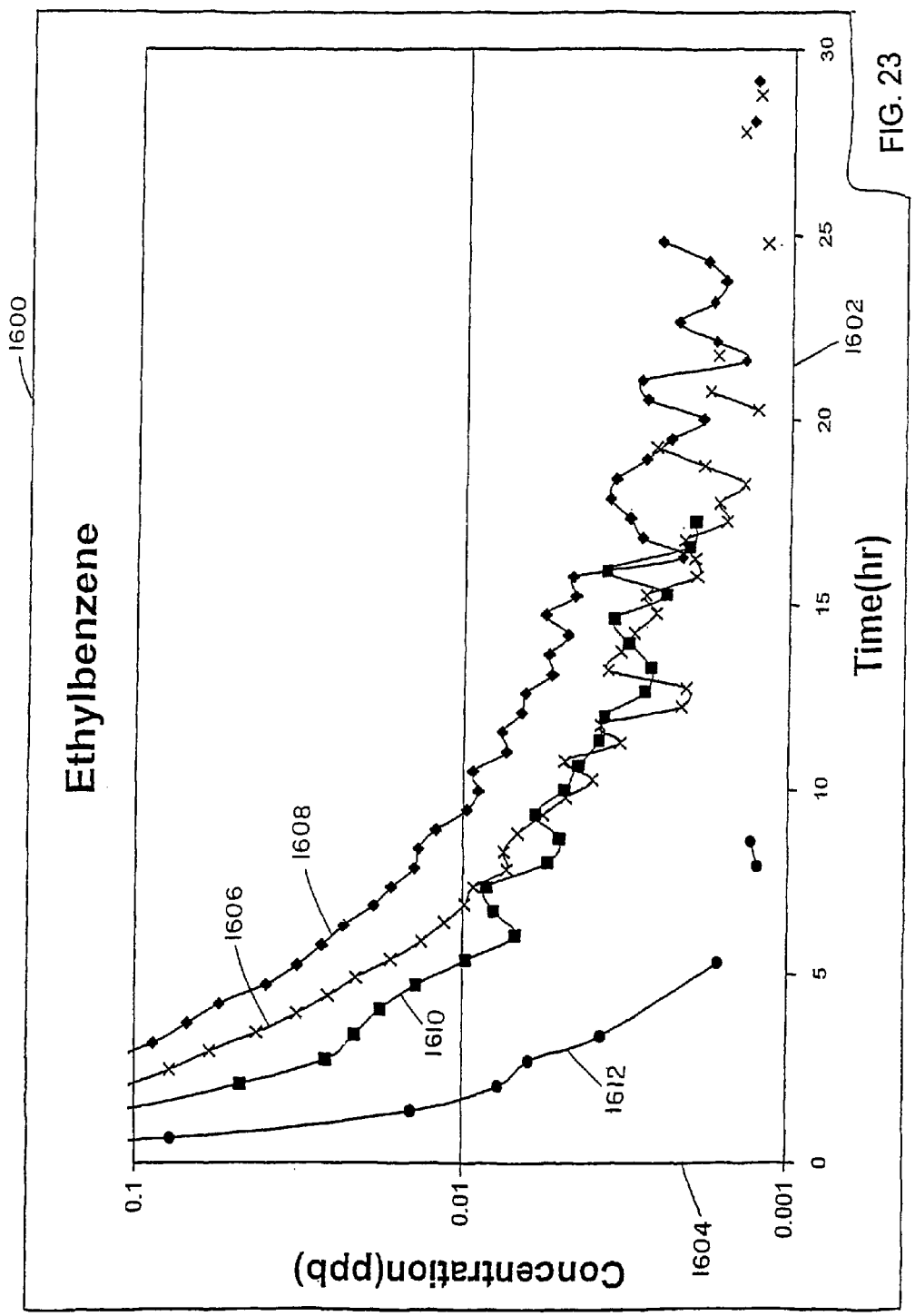
FIG. 23 is a graph of ethylbenzene concentration versus time for four purge gas mixtures exiting the wafer chamber of FIG. 5, the purge gases containing 20% oxygen in nitrogen, 100% nitrogen, 0.5% water in nitrogen and 100 ppm water in nitrogen.

FIG. 23 is a graph 1600 of time 1602 versus ethylbenzene concentration 1604 for four purge gas mixtures exiting the wafer chamber of FIG. 5, the purge gases containing 100% nitrogen, 20% oxygen, 0.5% water and 100 ppm water according to an embodiment of the present invention. The hydrocarbon-nitrogen contamination mixture was 60 ppb total hydrocarbon concentration, as described in Example 1. Data representing the purge response of ethylbenzene to UHP nitrogen 1608, 20% oxygen (by volume) in nitrogen 1606, 100 ppm water (by volume) in nitrogen 1610 and 0.5% water (by volume) in nitrogen 1612 are plotted in graph 1600.

Purging effectiveness increases as water concentration increases within the ranges of water concentration shown.

Figure 24:
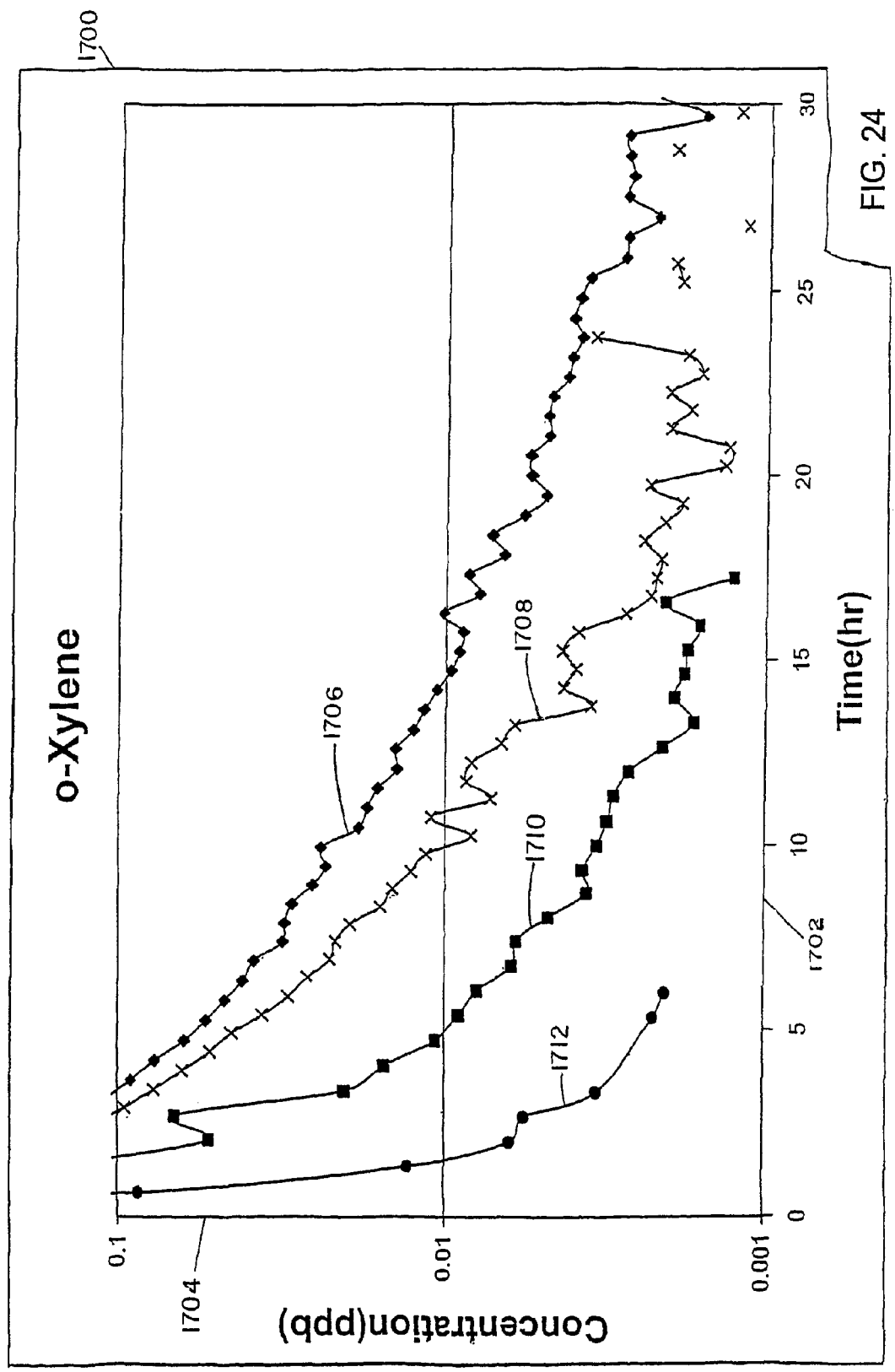
FIG. 24 is a graph of combined ortho-xylene concentration versus time for four purge gas mixtures exiting the wafer chamber of FIG. 5, the purge gases containing 20% oxygen in nitrogen, 100% nitrogen, 0.5% water in nitrogen and 100 ppm water in nitrogen.

FIG. 24 is a graph 1700 of time 1702 versus ortho-xylene concentration 1704 for four purge gas mixtures exiting the wafer chamber of FIG. 5, the purge gases containing 100% nitrogen, 20% oxygen, 0.5% water and 100 ppm water according to an embodiment of the present invention. The hydrocarbon-nitrogen contamination mixture was 60 ppb total hydrocarbon concentration, as described in Example 1. Data representing the purge response of ortho-xylene to UHP nitrogen 1706, 20% oxygen (by volume) in nitrogen 1708, 100 ppm water (by volume) in nitrogen 1710 and 0.5% water (by volume) in nitrogen 1712 are plotted in graph 1700. Purging effectiveness increases as water concentration increases within the ranges of water concentration shown.

Figure 25:
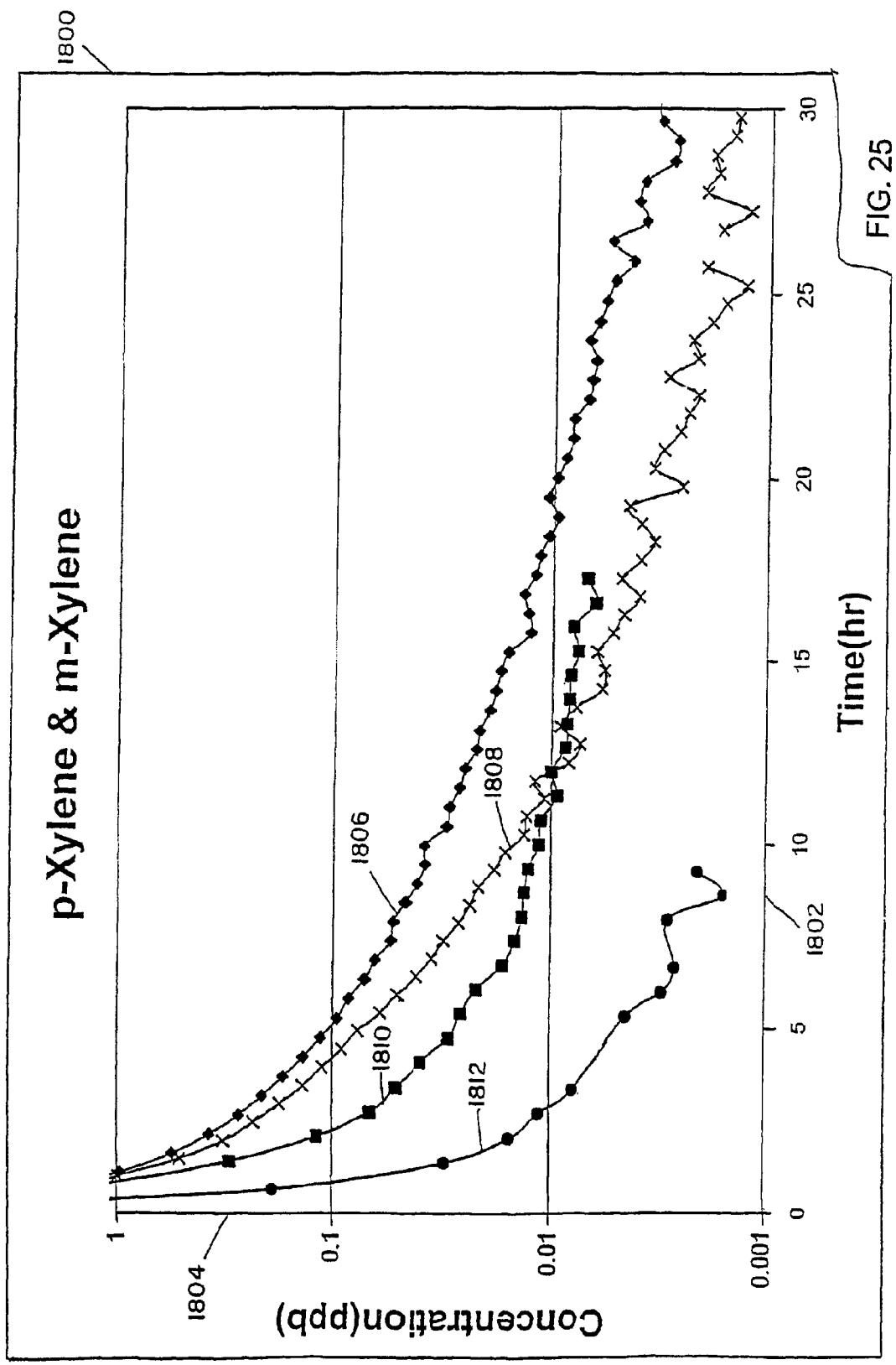
FIG. 25 is a graph of meta and para-xylene versus time for four purge gas mixtures exiting the wafer chamber of FIG. 5, the purge gases containing 20% oxygen in nitrogen, 100% nitrogen, 0.5% water in nitrogen and 100 ppm water in nitrogen.

FIG. 25 is a graph 1800 of time 1802 versus para- and meta-xylene 1804 for four purge gas mixtures exiting the wafer chamber of FIG. 5, the purge gases containing 100% nitrogen, 20% oxygen, 0.5% water and 100 ppm water according to an embodiment of the present invention. The hydrocarbon-nitrogen contamination mixture was 60 ppb total hydrocarbon concentration, as described in Example 1. Data representing the purge response of para- and meta-xylene to UHP nitrogen 1806, 20% oxygen (by volume) in nitrogen 1808, 100 ppm water (by volume) in nitrogen 1810 and 0.5% water (by volume) in nitrogen 1812 are plotted in graph 1600. Purging effectiveness increases as water concentration increases within the ranges of water concentration shown.

TABLE 1

Reduction in Dry Down Time Using Moisture

| Purge Gas Compared | Dry-Down Times Diffence (Hr) | | |
|---|---|---|---|
| | Ethyl-benzene | m,p-Xylene | o-Xylene |
| Dry N2 and 0.1% H2O in N2 | 5.03 | 9.60 | 7.57 |
| Dry N2 and 0.5% H2O in N2 | 6.37 | 12.25 | 9.57 |
| Dry XCDA and 0.1% H2O in XCDA | 2.23 | 5.42 | 4.83 |
| Dry XCDA and 0.5% H2O in XCDA | 3.70 | 6.93 | 4.93 |

Figure 26:
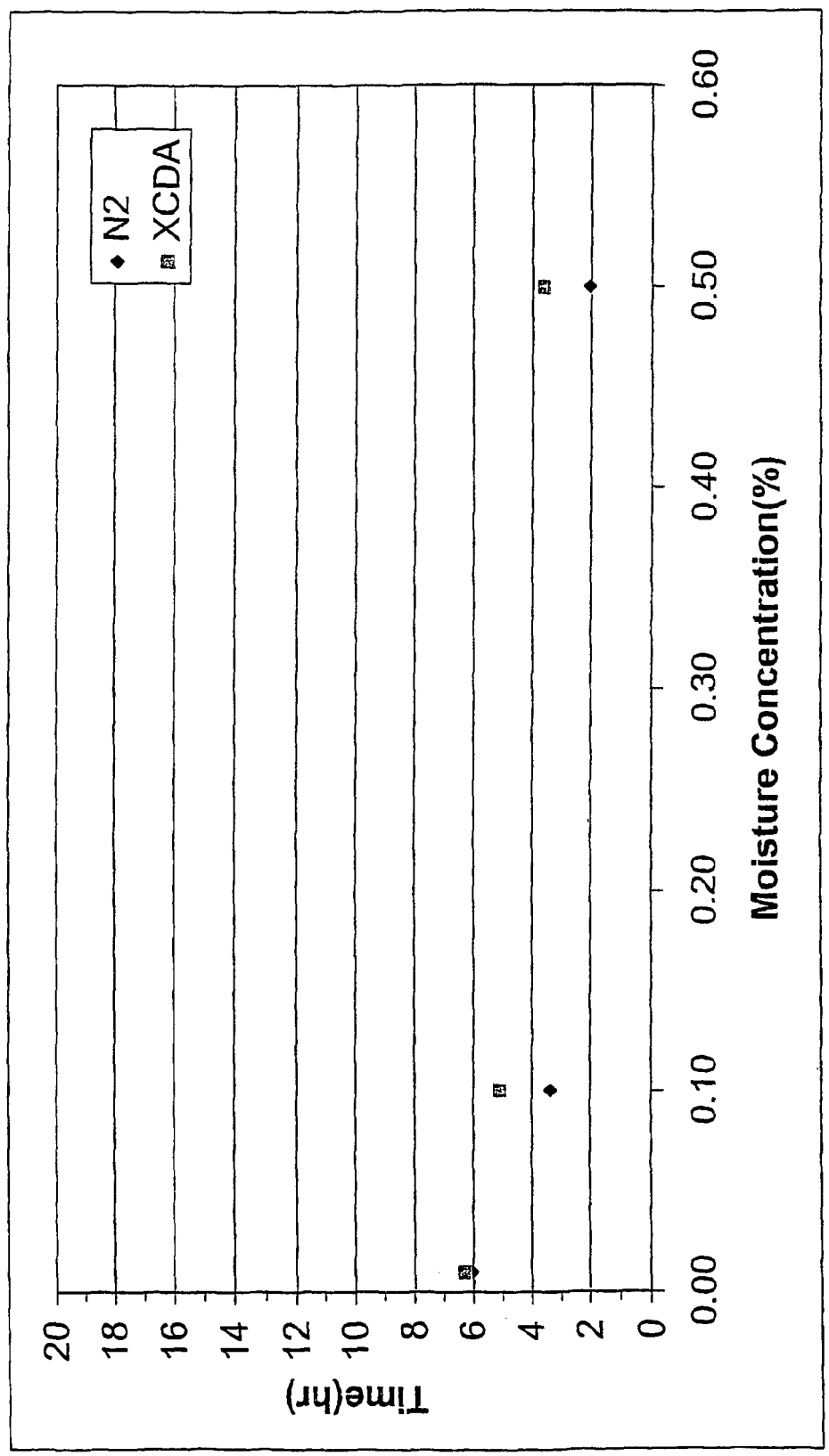
FIG. 26 is a graph of the time required to ethyl benzene levels to 10 ppt using various moisture concentrations in either $N_2$ or XCDA.
Figure 27:
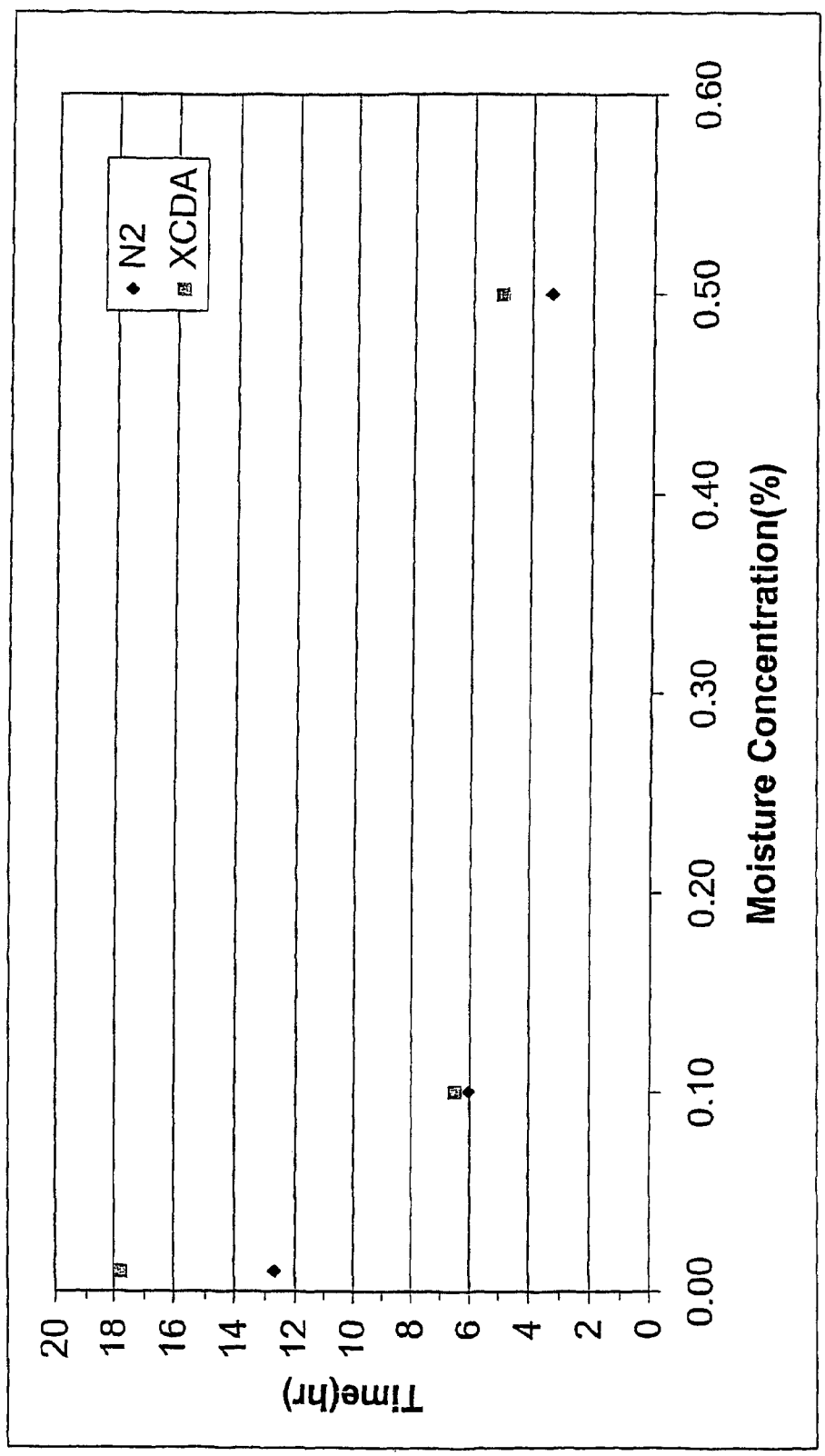
FIG. 27 is a graph of the time required to meta- and para-xylene levels to 10 ppt using various moisture concentrations in either $N_2$ or XCDA.
Figure 28:
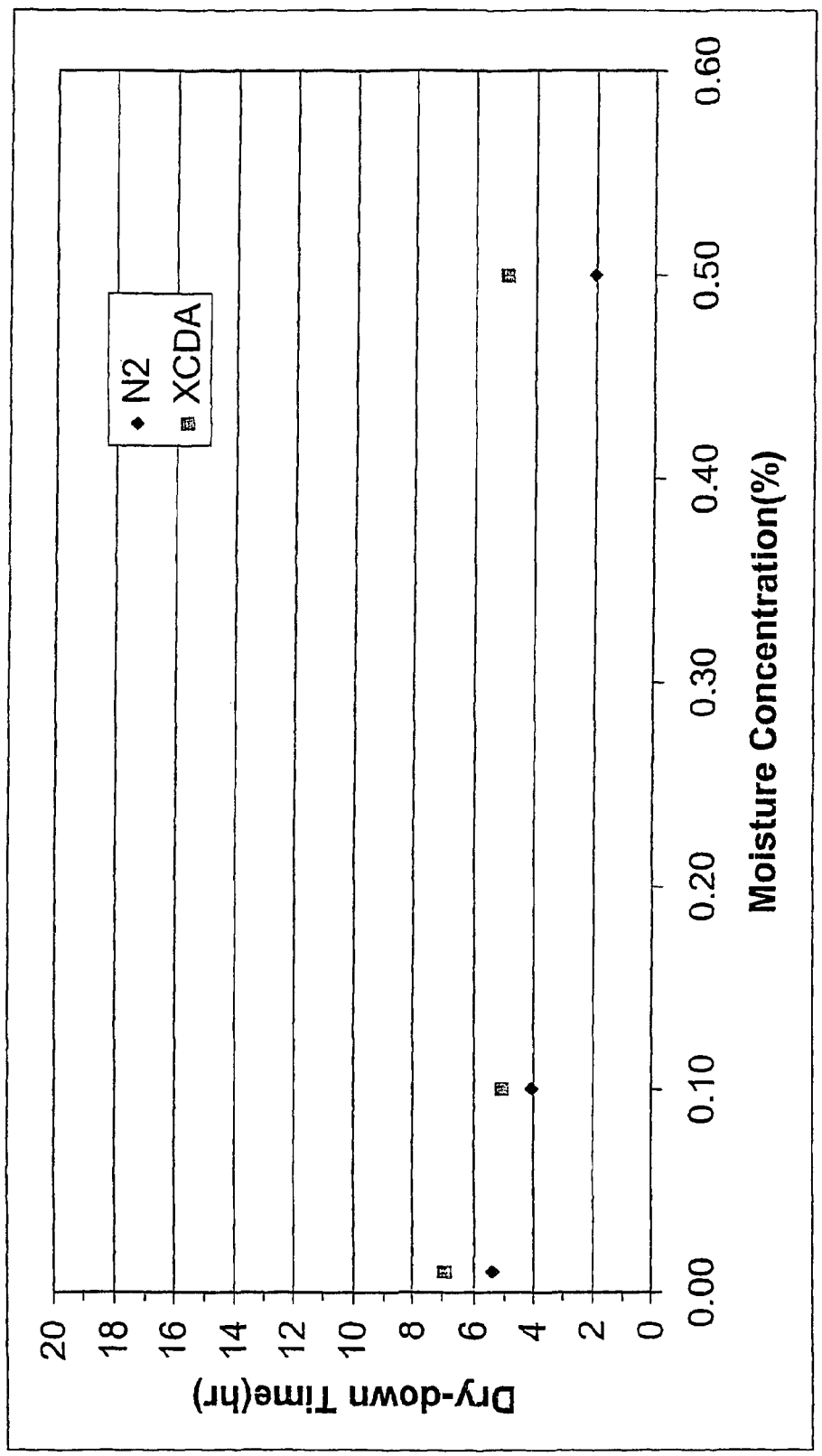
FIG. 28 is a graph of the time required to ortho-xylene levels to 10 ppt using various moisture concentrations in either $N_2$ or XCDA.

See FIGS. 26-28 which show dry-down times versus temperature or concentration.

EXAMPLE 6

Figure 29:
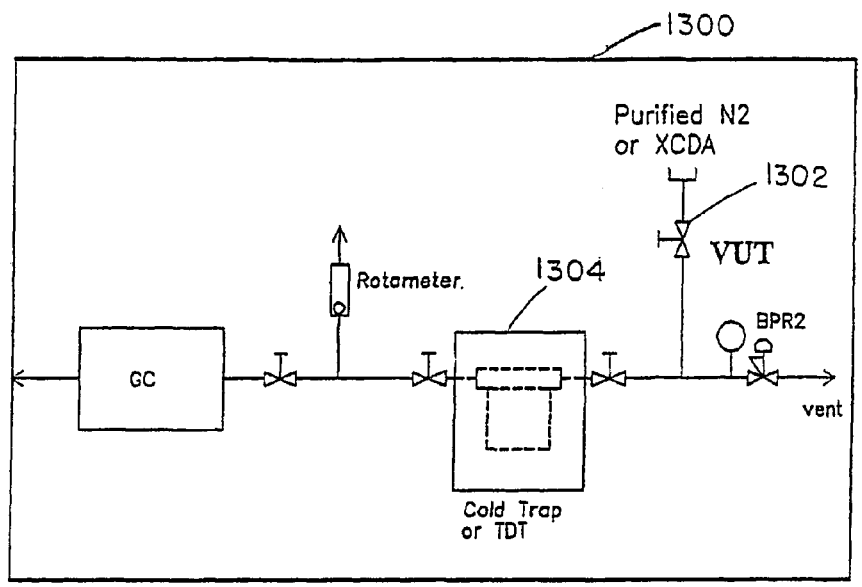
FIG. 29 is a schematic flow diagram of the testing setup according to an embodiment of the invention.

In a comparative test to determine the efficacy of XCDA as compared to nitrogen for decontamination of UHP equipment, a quantitative measurement system was assembled incorporating three commercial UHP diaphragm valves, each from a different manufacturer. The setup is shown in FIG. 29, 1300. To perform outgassing tests, each valve under test 1302, VUT, was connected directly upstream of the cold trap 1304 as shown. Purified sample gas (N₂ or XCDA) was sent through each VUT with a gas purity specification of less than 1 ppt hydrocarbon. The supply N₂ and XCDA were purified with an inert purifier (Aeronex, SS-500KF-I-4R) and optics purifier (Aeronex, SS-700KF-O-4R), respectively. A heater tape and temperature probe were wrapped around the VUT to heat and monitor the temperature (not shown). As the gas purged through the VUT, any desorbed contaminants were collected downstream in the cold trap for hydrocarbon analysis in the gas chromatogram 1304.

Figure 30:
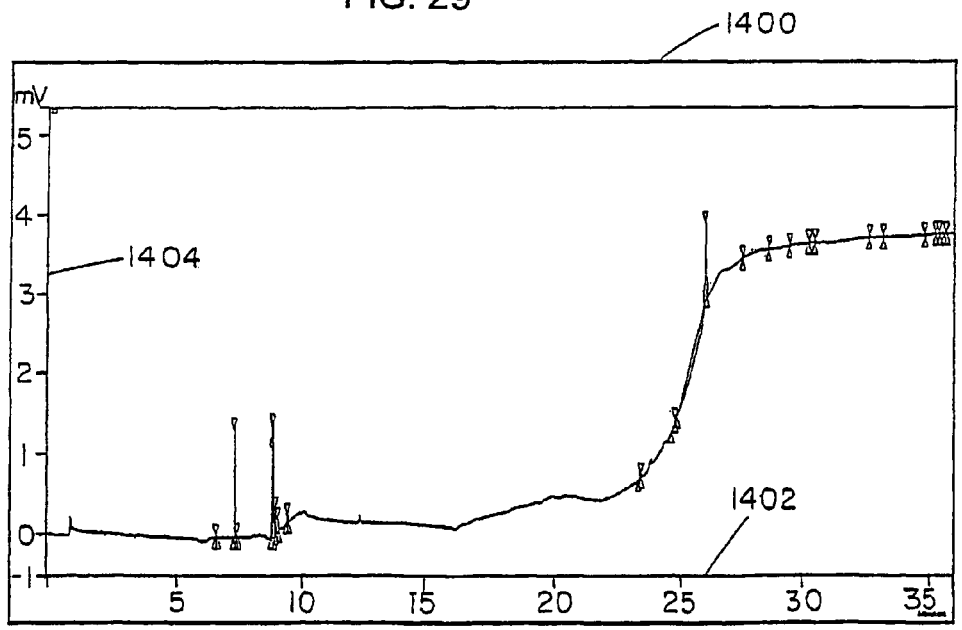
FIG. 30 is a chromatograph of typical valve outgassing immediately after installation.
Figure 31:
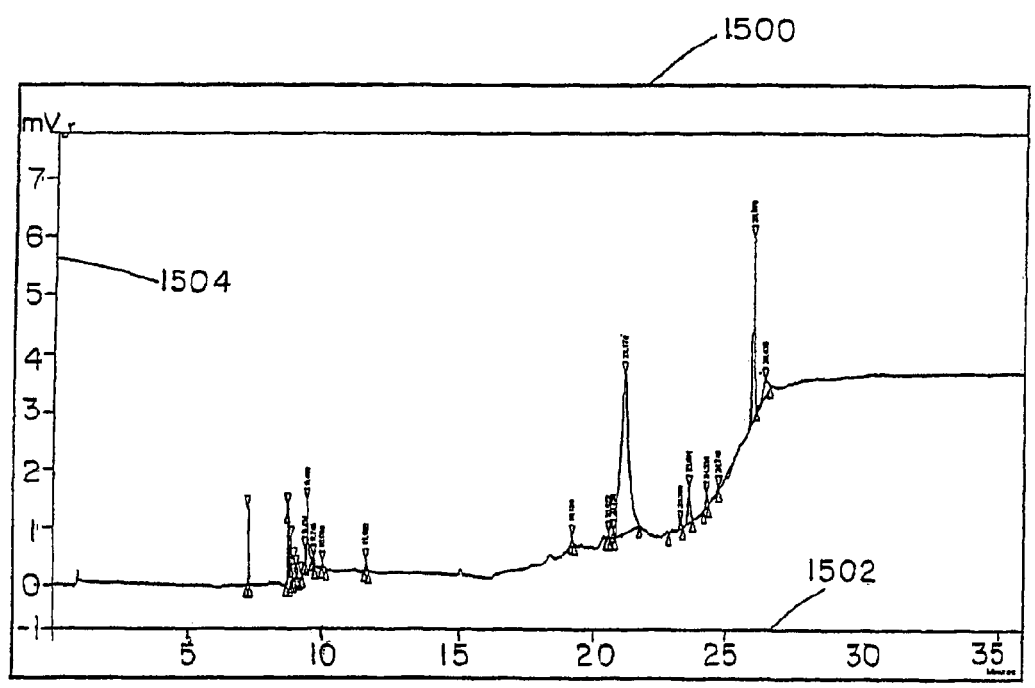
FIG. 31 is a chromatograph of typical valve outgassing at 80° C.

Valves were selected as representative of UHP system contamination sources since prior investigations had shown evidence of hydrocarbon contamination being generated by outgassing from elastomeric components in the valves. Detection and measurement was by means of cold trap collection and gas chromatographic measurement. The size of the contaminants was determined by retention time on the column (TOC) as compared to known standards. Chromatographs 1400 and 1500 showing time in minutes 1402 and 1502 versus m Volts 1404 and 1504, respectively from the outgassing of valves at two different temperatures, ambient and about 80° C., are shown in FIGS. 30 and 31. A rough analysis of the size of the contaminants based on the chromatographs is presented in Table 2 below.

TABLE 2

Analysis of contaminants by Total Organic Contaminants (TOC) by GC/FID

| Time | Compound | % outgassing |
|---|---|---|
| <10 min | <5 carbons | 10-20% |
| 10-16 min | 6-10 carbons | 0-5% |
| 16-25 min | 11-15 carbons | 20-40% |
| >25 min | >15 carbons | 50-80% |

It should be noted that the majority of the contaminants released are high molecular weight contaminants. This is in contrast to the prior examples where purging of low molecular weight hydrocarbons (i.e., less than 8 carbons) was analyzed.

Measurements were made at 0 and 60 minutes of system operation at ambient temperature (approximately 20° C.) and at 0, 60 and 720 minutes at 80° C. Measurements were made of both one-pass and two-pass purges by the different gases. In each case a nitrogen purge was followed by an XCDA purge. In the two-pass test the XCDA purge was followed by a second nitrogen purge. Tests of the three different UHP valves produced three different results. One valve started out with a low level of hydrocarbon outgassing and did not exceed 100 ppt even during elevated thermal XCDA testing, while another produced temperature sensitive contamination results. The remaining valve started out at 100 and peaked at 1000 ppt. On the positive side all valves through proper purging and thermal cycling were able to achieve levels at or below the 1 ppt lower limit of the detection capability of our test instruments. This indicates that through proper preconditioning any of these valves could be used in UHP piping system to deliver 1 ppt gas to the process. Results for the valve producing the 100-1000 ppt outgassing were as shown below in Table 3.

TABLE 3

Nitrogen vs. XCDA Purging of UHP Valves

| No. of Passes | Time (minutes) | Temperature (° C.) | Nitrogen (ppt) | | XCDA (ppt) |
|---|---|---|---|---|---|
| 1 | 0 | Ambient | 100 | | 50 |
| 1 | 60 | Ambient | 180 | | 50 |
| 1 | 0 | 80 | 1000 | | 40 |
| 1 | 60 | 80 | 700 | | 100 |
| 1 | 720 | 80 | 12 | | 0 |
| | | | 1st | 2nd | |
| 2 (N2) | 0 | Ambient | 100 | 0 | 50 |
| 2 (N2) | 60 | Ambient | 180 | 0 | 50 |
| 2 (N2) | 0 | 80 | 1000 | 0 | 40 |
| 2 (N2) | 60 | 80 | 700 | 0 | 100 |
| 2 (N2) | 720 | 80 | 12 | 0 | 0 |

It will be evident from the data of Table 3 that over all of the temperature and time ranges, purges with nitrogen produced only limited and quite unacceptable reductions of the hydrocarbon contamination of the valve. The subsequent purge with the XCDA reduced the hydrocarbon contaminant level to much lower levels, bettering the nitrogen purge lower limit by factors of 2-25. Further the XCDA purges to the low levels occurred in very short times as compared to the time required for the nitrogen purges to effect significant reductions. (The increases seen for the first nitrogen purge at ambient temperature and the XCDA purge at 80° C. between 0 and 60 minutes are believed to be due to the time required for some hydrocarbon contaminants within the elastomeric components to migrate to the surface for purging. This is a physical phenomenon of the elastomeric materials of the valve and not representative of the purge capabilities of the respective gases.)

The generally accepted protocol for UHP gas line validation requires extensive purging with nitrogen followed by verification that the line is contaminant free in a nitrogen purge environment. However, with all the valves XCDA volatilized additional hydrocarbons which remain after UHP nitrogen cleaning and thermal cycling. Even at ambient temperature, additional hydrocarbons were released when exposed to an oxygen rich purge gas.

A second series of tests were conducted to determine any effect from the order in which the purge gases were used. Two equivalent commercial valves from the same manufacturer were tested for hydrocarbon decontamination. One (A1) was purged with nitrogen followed by XCDA, and the other (A2) with XCDA followed by nitrogen. The results are presented in Table 4 below:

TABLE 4

Nitrogen/XCDA Purge vs. XCDA/Nitrogen Purge

| Time (minutes) | Temperature (° C.) | Valve A1 | | Valve A2 | |
|---|---|---|---|---|---|
| | | N2 (ppt) | XCDA (ppt) | XCDA (ppt) | N2 (ppt) |
| 0 | ambient | 50 | 50 | 50 | 90 |
| 60 | ambient | 10 | 190 | 19 | 9 |
| 0 | 80 | 220 | 220 | 510 | 2 |
| 60 | 80 | 200 | 100 | 35 | 2 |
| 720 | 80 | 10 | 5 | 0 | 0 |

The XCDA step at ambient temperature produced results similar to the nitrogen purge. However, when Valve A2 was heated to 80° C. under XCDA purge, the hydrocarbon outgassing rate increased significantly and then dropped quickly to below the limits of the detection equipment. Repeating the test in nitrogen showed little improvement. When purging with nitrogen, UHP components produced a continuous release of hydrocarbons. Actual peak values often did not occur until long after the initiation of purging due to the slow migration of heavier hydrocarbons through the piping system.

While this invention has been particularly shown and described with references to preferred embodiments thereof, it will be understood by those skilled in the art that various changes in form and details may be made therein without departing from the scope of the invention encompassed by the appended claims.

What is claimed is:

1. A method for the removal of airborne molecular contaminants (AMC) from a substrate, comprising:
   outgassing the AMC from a surface of the substrate under conditions that do not chemically change or alter the AMC, by contacting at least a portion of the substrate with a purified purge gas at a temperature of about 20° C. to 100° C., the purified purge gas comprising oxygen ($O_2$) and water, the purified purge gas having an AMC concentration less than about 1 part trillion (ppt) on a volume basis, the substrate contaminated with AMC before the substrate is contacted with the purified purge gas;
   producing a contaminated purge gas by transferring a portion of the outgassed contaminants from the substrate into the purified purge gas; and
   removing the contaminated purge gas from the substrate, thereby removing AMC from the substrate,
   wherein the portion of the outgassed contaminants is transferred into the purified purge gas by diffusion or desorption.

2. The method of claim 1, wherein the method is repeated until the contaminated purge gas has an AMC concentration below about 1 ppb AMC on a volume basis.

3. The method of claim 1, wherein the water comprises at least about 100 parts per million (ppm) by volume of the purified purge gas.

4. The method of claim 1, wherein the substrate comprises at least one silicon substrate.

5. The method of claim 1, wherein the substrate is an interior surface of an ultrahigh purity gas line component.

6. The method of claim 1, wherein the substrate is the interior surface of a valve.

7. The method of claim 1, further comprising purging the substrate with an inert gas to remove at least one of oxygen and water after removing the contaminated purge gas from the substrate.

8. The method of claim 1, wherein the substrate is an electropositive surface.

9. The method of claim 1, wherein the substrate is an electropolished surface.

10. The method of claim 1, wherein the substrate is a wafer.

11. The method of claim 1, wherein the purified purge gas comprises oxygen at a concentration between about 1% and 25% on a volume basis.

12. The method of claim 1, wherein oxygen of the purified purge gas is provided as a component in extra clean dry air (XCDA).

13. The method of claim 1 further comprising:
   purifying a purge gas to produce the purified purge gas for contacting with the substrate.

14. The method of claim 1, wherein the method is performed at a temperature no higher than about 80° C.

15. The method of claim 1, wherein the AMC concentration of the purified purge gas is less than about 100 parts per trillion (ppt) on a volume basis.

16. The method of claim 3, wherein the water comprises about 100 ppm to about 0.5% by volume of the purge gas.

17. The method of claim 7, wherein the inert gas is selected from the group consisting of nitrogen, noble gases, methane and combinations thereof.

18. The method of claim 14, wherein the method is performed at a temperature no higher than about 50° C.

19. The method of claim 17, wherein the inert gas is argon.

20. A method for the removal of airborne molecular contaminants (AMC) from a substrate, comprising:
   outgassing the AMC from a surface of the substrate under conditions that do not chemically change or alter the AMC, by contacting at least a portion of the substrate with a purified purge gas at a temperature of about 20° C. to 100° C., the purified purge gas comprising oxygen ($O_2$) and water, the purified purge gas having an AMC concentration less than about 1 part per trillion (ppt) on a volume basis;

producing a contaminated purge gas by transferring the outgassed AMC from the substrate into the purified purge gas; and removing the contaminated purge gas from the substrate, wherein the oxygen and water in the purified purge gas are in an amount sufficient to outgas AMC from the substrate at a faster rate than the method using a purge gas consisting essentially of nitrogen gas, wherein the portion of the outgassed contaminants is transferred into the purified purge gas by diffusion or desorption.

21. The method of claim 20, wherein the method is performed at a temperature no higher than about 80° C.

22. A method for the removal of airborne molecular contaminants (AMC) from a substrate, comprising:

outgassing the AMC from a surface of the substrate under conditions that do not chemically change or alter the AMC, by contacting at least a portion of the substrate with a humidified purge gas comprising extra clean dry air (XCDA) which has been humidified by the addition of water vapor thereto, the humidified purge gas having an AMC concentration less than about 1 part per trillion (ppt) on a volume basis;

producing a contaminated purge gas by transferring a portion of the outgassed contaminants from the substrate into the purified purge gas; and removing the contaminated purge gas from the substrate, thereby removing AMC from the substrate, wherein the portion of the outgassed contaminants is transferred into the purified purge gas by diffusion or desorption.

23. A method for the removal of airborne molecular contaminants (AMC) from a substrate, comprising:

outgassing the AMC from a surface of the substrate by contacting at least a portion of the substrate with a purified purge gas under conditions that do not chemically change or alter the AMC, the purified purge gas comprising oxygen ($O_2$) and water, the purified purge gas having an AMC concentration less than about 1 part per trillion (ppt) on a volume basis, the substrate contaminated with AMC before the substrate is contacted with purified purge gas;

producing a contaminated purge gas by transferring a portion of the outgassed contaminants from the substrate into the purified purge gas; and removing the contaminated purge gas from the substrate, thereby removing AMC from the substrate, wherein the portion of the outgassed contaminants is transferred into the purified purge gas by diffusion or desorption.

24. A method for purging organic contaminants from an organic contaminated component in a semiconductor manufacturing process, comprising:

causing the organic contaminants to outgas from a surface of the organic contaminated component in the semiconductor manufacturing process by contacting at least a portion of the surface with a purified purge gas comprising oxygen ($O_2$) and water under conditions that do not chemically change or alter the AMC;

transferring a portion of the outgassed organic contaminants from the organic contaminated component in the semiconductor manufacturing process into the purified purge gas to produce a contaminated purge gas comprising the outgassed organic contaminants, wherein the portion of the outgassed contaminants is transferred into the purified purge gas by diffusion or desorption;

removing the contaminated purge gas from the component in the semiconductor manufacturing process; and repeating the above steps until an outgassing rate at the surface of the component in the semiconductor manufacturing process is reduced to 1 ppt or less.

25. A method for purging airborne molecular contaminants (AMC) from a component in a semiconductor manufacturing process, comprising:

outgassing the AMC from a surface of the substrate under conditions that do not chemically change or alter the AMC, by contacting at least a portion of the component in the semiconductor manufacturing process with a purified purge gas comprising oxygen ($O_2$) and water at a temperature of about 20° C. to 100° C., the purified purge gas having an AMC concentration less than about 1 part per trillion (ppt) on a volume basis, the component in the semiconductor manufacturing process contaminated with AMC before the component is contacted with the purified purge gas;

producing a contaminated purge gas by transferring a portion of the outgassed contaminants from the component in the semiconductor manufacturing process into the purified purge gas, wherein the portion of the outgassed contaminants is transferred into the purified purge gas by diffusion or desorption; and removing the contaminated purge gas from the component in the semiconductor manufacturing process, thereby removing AMC from the component in the semiconductor manufacturing process.

26. A method for the removal of airborne molecular contaminants (AMC) from a substrate, comprising:

dehumidifying a purified purge gas comprising oxygen ($O_2$);

adding a controlled amount of ultrapure water to the dehumidified purified purge gas comprising oxygen ($O_2$) to form a purified purge gas comprising oxygen ($O_2$) and water having an AMC concentration less than about 1 part per trillion (ppt) on a volume basis;

outgassing the AMC from a surface of the substrate by contacting at least a portion of the substrate under conditions that do not chemically change or alter the AMC, with the purified purge gas comprising oxygen ($O_2$) and water;

producing a contaminated purge gas by transferring a portion of the outgassed contaminants from the substrate into the purified purge gas comprising oxygen ($O_2$) and water, wherein the portion of the outgassed contaminants is transferred into the purified purge gas by diffusion or desorption; and removing the contaminated purge gas from the substrate, thereby removing AMC.

* * * * *

UNITED STATES PATENT AND TRADEMARK OFFICE
CERTIFICATE OF CORRECTION

| | | |
|---|---|---|
| PATENT NO. | : 8,075,704 B2 | Page 1 of 1 |
| APPLICATION NO. | : 10/523371 | |
| DATED | : December 13, 2011 | |
| INVENTOR(S) | : Jeffrey J. Spiegelman et al. | |

It is certified that error appears in the above-identified patent and that said Letters Patent is hereby corrected as shown below:

IN THE CLAIMS:

In column 16, line 21, claim 3, please delete "water" and insert -- purified purge gas --.

In column 16, lines 22-23, claim 3, please delete "the purified purge gas" and insert -- water --.

At column 16, lines 50-52, delete entire Claim 15.

In column 16, line 53, claim 16, please delete "water" and insert -- purified purge gas --.

In column 16, line 54, claim 16, please delete "the purge gas" and insert -- water --.

Signed and Sealed this
Fifteenth Day of May, 2012

David J. Kappos
*Director of the United States Patent and Trademark Office*